(12) United States Patent
Britton, Jr. et al.

(10) Patent No.: US 7,936,270 B2
(45) Date of Patent: May 3, 2011

(54) SPACE CHARGE DOSIMETERS FOR EXTREMELY LOW POWER MEASUREMENTS OF RADIATION IN SHIPPING CONTAINERS

(75) Inventors: Charles L. Britton, Jr., Alcoa, TN (US);
Mark A. Buckner, Oak Ridge, TN (US);
Gregory R. Hanson, Clinton, TN (US);
William L. Bryan, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 209 days.

(21) Appl. No.: 12/406,680

(22) Filed: Mar. 18, 2009

(65) Prior Publication Data

US 2010/0072380 A1 Mar. 25, 2010

Related U.S. Application Data

(62) Division of application No. 10/840,553, filed on May 6, 2004, now Pat. No. 7,525,431.

(51) Int. Cl.
*G08B 13/14* (2006.01)
*H01L 29/76* (2006.01)
*H01L 23/28* (2006.01)
*G01T 1/24* (2006.01)

(52) U.S. Cl. ........... 340/572.1; 250/370.01; 250/370.14; 250/370.15; 257/701; 257/787; 257/213

(58) Field of Classification Search ................ None
See application file for complete search history.

(56) References Cited

U.S. PATENT DOCUMENTS

| | | | | |
|---|---|---|---|---|
| 4,970,391 | A * | 11/1990 | Uber, III | 250/374 |
| 4,976,266 | A * | 12/1990 | Huffman et al. | 600/436 |
| 5,739,541 | A * | 4/1998 | Kahilainen | 250/370.07 |
| 5,835,012 | A | 11/1998 | Wilk et al. | |
| 5,920,096 | A * | 7/1999 | Lee | 257/355 |
| 6,172,368 | B1 * | 1/2001 | Tarr et al. | 250/370.07 |
| 6,232,626 | B1 * | 5/2001 | Rhodes | 257/292 |
| 6,339,372 | B1 | 1/2002 | Warnock et al. | |
| 6,423,972 | B1 * | 7/2002 | Fehrenbacher et al. | 250/370.05 |
| 6,531,739 | B2 * | 3/2003 | Cable et al. | 257/347 |
| 6,577,132 | B2 * | 6/2003 | Bartulos | 324/404 |
| 6,591,084 | B1 | 7/2003 | Chuprun et al. | |

(Continued)

FOREIGN PATENT DOCUMENTS

GB 2209859 5/1989

(Continued)

*Primary Examiner* — Julie Lieu
(74) *Attorney, Agent, or Firm* — Brinks Hofer Gilson & Lione

(57) ABSTRACT

Methods and apparatus are described for space charge dosimeters for extremely low power measurements of radiation in shipping containers. A method includes insitu polling a suite of passive integrating ionizing radiation sensors including reading-out dosimetric data from a first passive integrating ionizing radiation sensor and a second passive integrating ionizing radiation sensor, where the first passive integrating ionizing radiation sensor and the second passive integrating ionizing radiation sensor remain situated where the dosimetric data was integrated while reading-out. Another method includes arranging a plurality of ionizing radiation sensors in a spatially dispersed array; determining a relative position of each of the plurality of ionizing radiation sensors to define a volume of interest; collecting ionizing radiation data from at least a subset of the plurality of ionizing radiation sensors; and triggering an alarm condition when a dose level of an ionizing radiation source is calculated to exceed a threshold.

2 Claims, 8 Drawing Sheets

U.S. PATENT DOCUMENTS

| | | | |
|---|---|---|---|
| 6,614,025 B2 * | 9/2003 | Thomson et al. | 250/370.01 |
| 7,157,715 B1 * | 1/2007 | Crain et al. | 250/370.07 |
| 7,323,634 B2 * | 1/2008 | Speakman | 136/256 |
| 7,732,816 B2 * | 6/2010 | Fazan et al. | 257/71 |
| 2002/0014955 A1 | 2/2002 | Klitsgaard et al. | |
| 2002/0040968 A1 * | 4/2002 | Black et al. | 250/393 |
| 2003/0006907 A1 | 1/2003 | Lovegreen et al. | |
| 2003/0149526 A1 | 8/2003 | Zhou et al. | |
| 2003/0193032 A1 | 10/2003 | Marshall | |
| 2004/0078306 A1 | 4/2004 | Whiteley et al. | |

FOREIGN PATENT DOCUMENTS

WO    WO 2005/006110    1/2005

\* cited by examiner

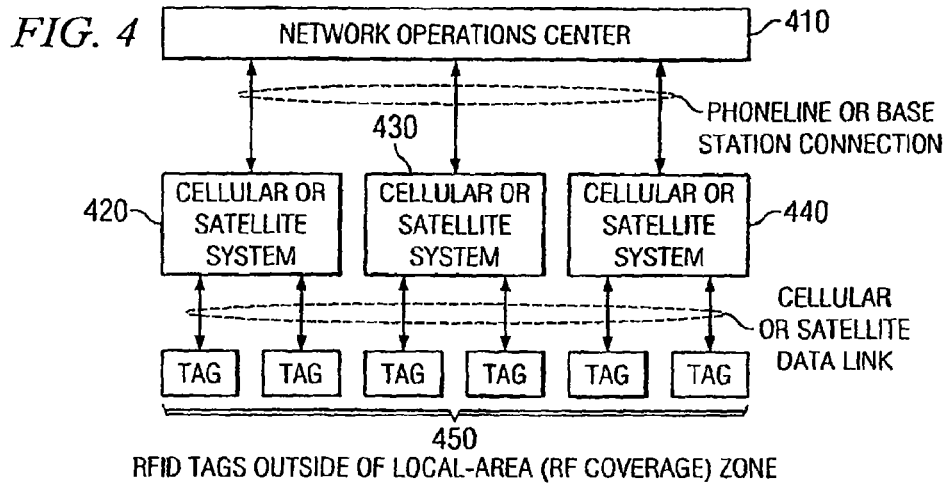
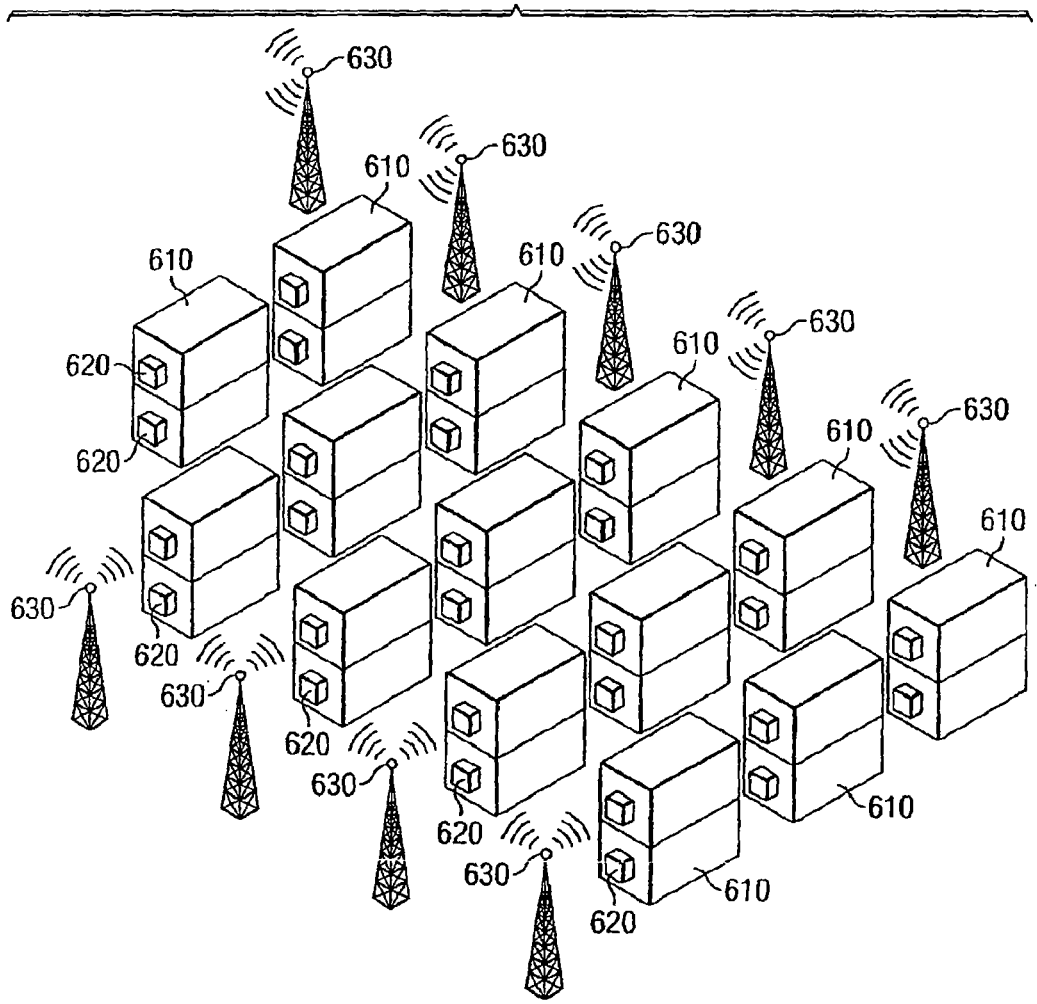

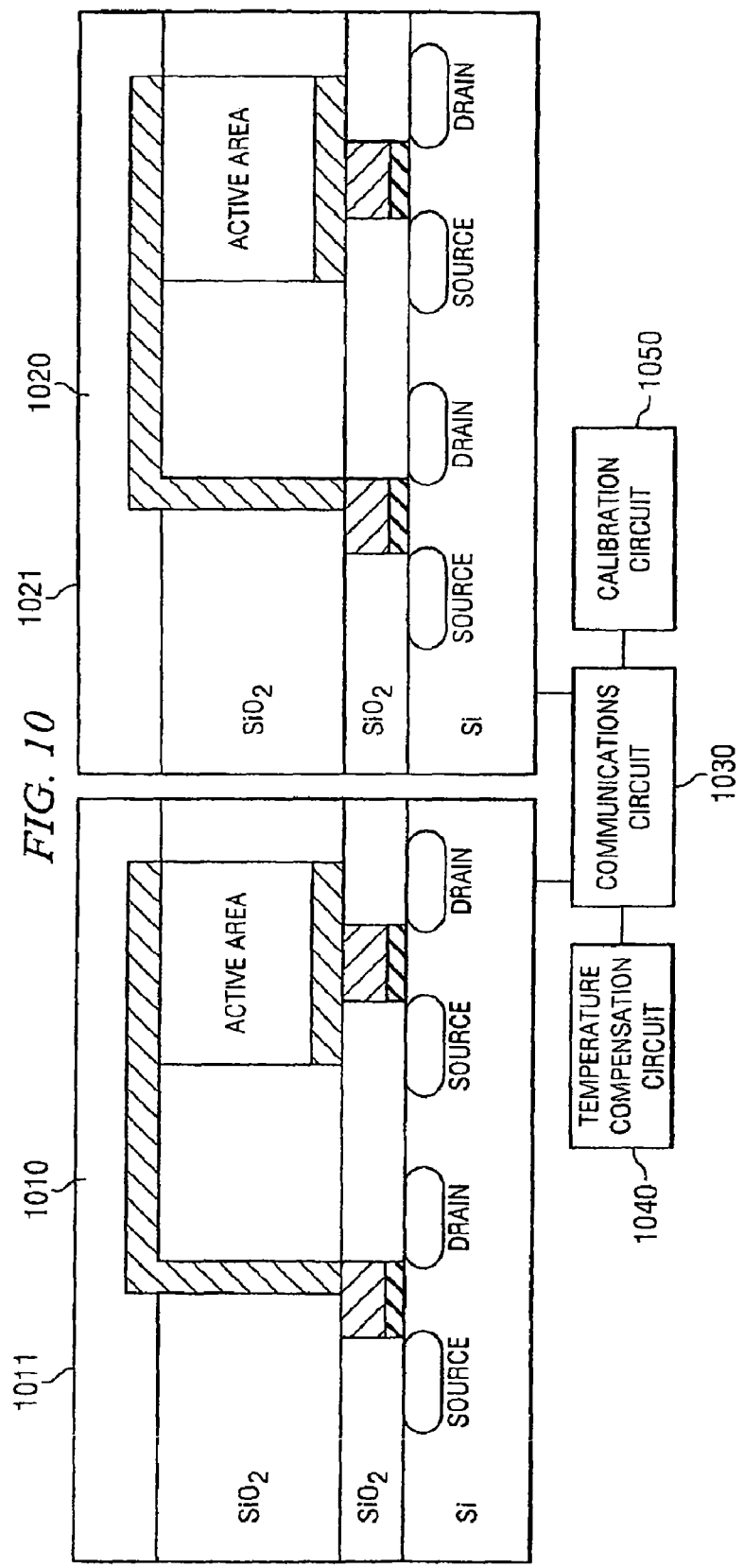

SPACE CHARGE DOSIMETERS FOR EXTREMELY LOW POWER MEASUREMENTS OF RADIATION IN SHIPPING CONTAINERS

RELATED APPLICATIONS

This application is a divisional application of U.S. application Ser. No. 10/840,553, filed on May 6, 2004 now U.S. Pat. No. 7,525,431 (the entire content of which is hereby incorporated by reference).

STATEMENT AS TO RIGHTS TO INVENTIONS MADE UNDER FEDERALLY-SPONSORED RESEARCH OR DEVELOPMENT

This invention was made with United States Government support under prime contract No. DE-AC05-00OR22725 to UT-Battelle, L.L.C. awarded by the Department of Energy. The Government has certain rights in this invention.

BACKGROUND OF THE INVENTION

1. Field of the Invention

An embodiment of the invention relates generally to the field of space charge dosimeters. More particularly, an embodiment of the invention relates to space charge dosimeters for extremely low power measurements of radiation in shipping containers.

2. Discussion of the Related Art

The worldwide ocean-going freight transportation infrastructure, known as the Marine Transportation System (MTS), is under stress from several fronts including: terrorism, antiquated technology, environmental restrictions, just-in-time manufacturing practices, overlapping state/federal/local jurisdictions, and a lack of basic technological infrastructure. Terrorist attacks may likely focus on economic terrorism to affect change in the modern world. One need only look to the open movement of containerized cargo to find simple, effective, and efficient means of large-scale economic damage (RFID Journal, 2003). The destruction, or the stoppage of flow at a few key ports could damage our economy and cripple the nation in a matter of weeks (Flynn, 2003). Consequently, there is a need to develop and deploy tracking and monitoring technologies at the container level to help secure the global supply chain and the critical port facilities that service the economic well-being of our nation and other nations (Gills and McHugh, 2002; Bonner, 2002; Verton, 2002).

A port is an assemblage of many facilities, entities and functions including: federal stakeholders (e.g., U.S. Customs, Coast Guard, DOD, TSA, FBI, etc.), state government stakeholders (e.g., Ports Authority, State Law Enforcement, Emergency Preparedness, etc.), and local stakeholders (e.g., local law enforcement, local fire departments, port security, and commercial terminal operators, labor unions, etc.). Developing additional facilities to network the critical components of operations at each port to provide for port security/management and ship/cargo security/tracking/management will aid in efficient use and safety of each port. Ultimately, these local port facilities should be linked to a regional center and/or national center with potential for international expansion. Consequently, there is a need to adopt technologies, such as geographic information systems (GIS), global satellite communications, the internet, and wireless monitoring/tracking/security infrastructure in managing/securing the modern supply chain preferably with an open systems architecture to allow multiple public and private entities to participate.

Shipping via the Marine Transportation System (MTS) totaled $480 billion in cargo and contributed $750 billion to the U.S. gross domestic product in calendar year 1999, and the current volume of domestic maritime shipping is expected to double (USDOT, 1999) over the next 20 years. International maritime shipping is expected to triple over the same time period (Prince, 2001). Many port facilities are under economic stress from the above-noted several fronts, including antiquated technology, environmental restrictions, just-in-time manufacturing practices, overlapping federal/state/local jurisdictions, and the lack of basic technological infrastructure to orchestrate a secure and efficient container management system. In addition, land competition and environmental regulations will restrict the geographic expansion of most current port facilities. The information systems tasked with managing containers are still largely dependent on manual data entry. Consequently, there is a need for automated technology solutions to increase efficiency and security in port facilities (Gills and McHugh, 2002; Verton, 2002; Gillis, 2002).

In addition to concerns about MTS economic inefficiencies, the MTS currently has an unprecedented emphasis on homeland security. In 2001, 5.7 million containers entered the U.S. via the MTS (Gills and McHugh, 2002). U.S. Customs inspects less than 2% of these containers manually, relying on intelligence to "profile" containers. The Coast Guard and U.S. Customs do not have the manpower or resources to manually search each container entering the U.S., and doing so would bring the supply chain to a catastrophic halt (Loy, 2002). Intelligent profiling of cargo and containers is critical to securing the global supply chain and enabling legitimate commerce. Tracking and monitoring would provide better data from which to build intelligent profiles. Therefore, there is a need for investment in appropriate tracking and monitoring technology as the key to increased security and economic efficiency (Flynn, 2003).

A key concern with containerized cargo transportation is the relative ease with which a thermonuclear device or radioactive material for a "dirty bomb" could be smuggled into the target country in a shipping container. A significant specific problem for Homeland Security is the potential shipping of radioactive material for a "dirty bomb" into the United States in a shipping container. The standard marine shipping container has become the dominant method of importing and exporting goods worldwide. The number of containers arriving and departing from US ports each day is so large that only an extremely small fraction is ever inspected. Since only a small fraction of containers can ever be inspected, some method must be employed to "flag" containers for inspection. Locating sensor portals through which each container must pass at each port facility is considered unrealistic. Such a bottle neck could cost the US economy billions of dollars each day. Employing a radiation sensor in, on or near the cargo container to look for elevated levels of radiation would be one method of flagging containers.

However, there are problems with existing radiation sensors that have been proposed for shipping containers. First, existing radiation sensors must use power during the dose integration (active sensing) time. Existing active radiation sensors must either utilize very short integration times, thus reducing sensitivity, or they will use up their available battery power long before the end of the service life of the container. Replacing batteries requires maintenance personal time, coordination between the maintenance schedule and the physical location of the container and logistical support. There is a need for radiation sensors with a much longer unattended service life.

Second, existing active radiation sensors do not make the dose integration data available for secure and uninterrupted monitoring of the each container. Reading the dose integration data requires that the individual sensors be removed and read, or at least individually read, leading to the same problems of costly maintenance personal time, coordination between the data collection schedule and the physical location of the container and logistical support. There is a need for radiation sensors that make the dose integration data automatically and remotely available for intelligent profiling and analysis.

Third, existing active radiation sensors are prone to false alarms. Existing active radiation sensors cannot discriminate between different types of radiation leading to false alarms from substances used for medical diagnosis and even from benign cargo such as bananas which naturally contain concentrations of ionizing radiation substances (e.g., potassium). There is a need for more sophisticated and discriminatory radiation sensors.

Heretofore, the requirements of container-level tracking and monitoring by long-life sensors, making the critical data automatically and remotely available for intelligent profiling and analysis and reducing false alarms have not been met. What is needed is a global container security and asset (ship and cargo) tracking system that satisfies (preferably simultaneously all of) these requirements.

SUMMARY OF THE INVENTION

There is a need for the following embodiments of the invention. Of course, the invention is not limited to these embodiments.

According to an embodiment of the invention, a method comprises: transmitting identification data, location data and environmental state sensor data from a radio frequency tag. According to another embodiment of the invention, an apparatus comprises: a radio frequency tag that transmits identification data, location data and environmental state sensor data.

According to another embodiment of the invention, a method comprises transmitting identification data and location data from a radio frequency tag using hybrid spread-spectrum modulation. According to another embodiment of the invention, an apparatus comprises a radio frequency tag that transmits both identification data and location data using hybrid spread-spectrum modulation.

According to another embodiment of the invention, a method comprises insitu polling a suite of passive integrating ionizing radiation sensors including reading-out dosimetric data from a first passive integrating ionizing radiation sensor and a second passive integrating ionizing radiation sensor, wherein the first passive integrating ionizing radiation sensor and the second passive integrating ionizing radiation sensor remain situated where the dosimetric data was integrated while reading-out. According to another embodiment of the invention, an apparatus comprises a first passive integrating ionizing radiation sensor; a second passive integrating ionizing radiation sensor coupled to the first passive integrating ionizing radiation sensor; and a communications circuit coupled to the first passive integrating ionizing radiation sensor and the second passive integrating ionizing radiation sensor, wherein the first passive integrating ionizing radiation sensor and the second passive integrating ionizing radiation sensor read-out dosimetric data to the communications circuit.

According to another embodiment of the invention, a method comprises arranging a plurality of ionizing radiation sensors in a spatially dispersed array; determining a relative position of each of the plurality of sensors to define a volume of interest; collecting ionizing radiation data from at least a subset of the plurality of ionizing radiation sensors; and triggering an alarm condition when a dose level of an ionizing radiation source is calculated to exceed a threshold. According to another embodiment of the invention, an apparatus comprises a plurality of ionizing radiation sensors arranged in a spatially dispersed array where a relative position of each of the plurality of sensors array is determined to define a volume of interest; a data collection circuit coupled to the plurality of ionizing radiation sensors to collect ionizing radiation data from at least a subset of the plurality of ionizing radiation sensors; and a computer coupled to the data collection circuit to i) calculate a dose level of an ionizing radiation source and compare the dose level to a threshold and ii) trigger an alarm when the dose level is equal to or greater than the threshold.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of an embodiment of the invention without departing from the spirit thereof, and embodiments of the invention include all such substitutions, modifications, additions and/or rearrangements.

BRIEF DESCRIPTION OF THE DRAWINGS

The drawings accompanying and forming part of this specification are included to depict certain embodiments of the invention. A clearer conception of embodiments of the invention, and of the components combinable with, and operation of systems provided with, embodiments of the invention, will become more readily apparent by referring to the exemplary, and therefore nonlimiting, embodiments illustrated in the drawings. Embodiments of the invention may be better understood by reference to one or more of these drawings in combination with the description presented herein. It should be noted that the features illustrated in the drawings are not necessarily drawn to scale.

FIG. 4 illustrates a schematic view of a bi-directional communications between RFID tags and a network operations center (NOC) when utilizing the cellular or satellite communications during over-the-road or rail transportation, representing an embodiment of the invention.

FIG. 6 illustrates a schematic perspective view of readers and RFID tags in the context of a stacked array of containers, representing an embodiment of the invention.

FIG. 10 illustrates a schematic block diagram of an insitu polled suite of sensors, each sensor having a different filter, representing an embodiment of the invention.

DESCRIPTION OF PREFERRED EMBODIMENTS

Figure 1:
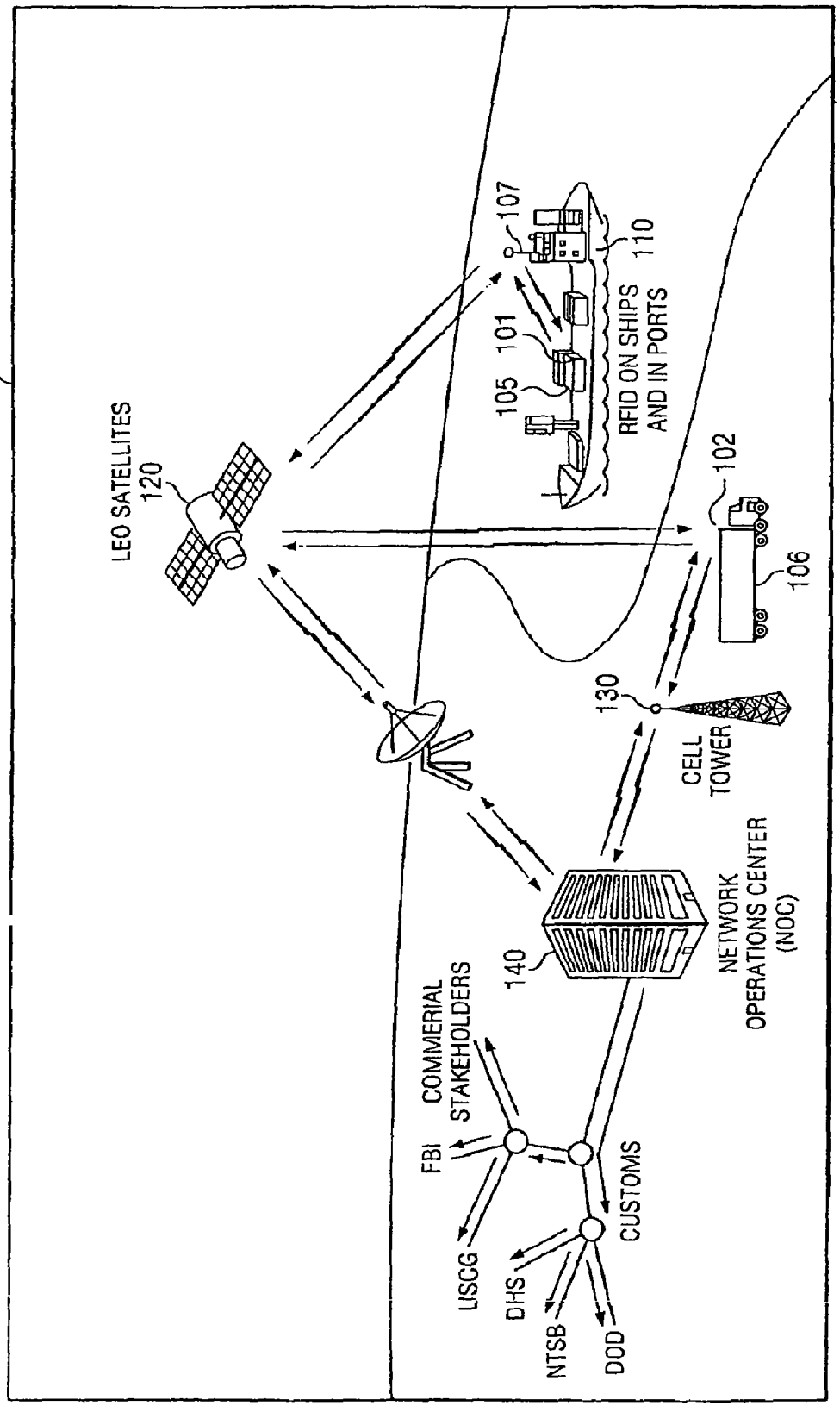
FIG. 1 illustrates a schematic perspective overview of a marine asset security and tracking (MAST) system, representing an embodiment of the invention.

Embodiments of the invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the embodiments of the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

The below-referenced U.S. patents, PCT published applications designating the U.S. and U.S. patent applications disclose embodiments that are useful for the purposes for which they are intended. The entire contents of U.S. Pat. Nos. 6,603,818; 6,606,350; 6,625,229; 6,621,878; 6,556,942 are hereby expressly incorporated by reference herein for all purposes. The entire contents of PCT published application Nos. WO 02/27992; WO 02/19550; WO 02/19293; and WO 02/23754 are hereby incorporated by reference for all purposes. The entire contents of U.S. Ser. No. 09/671,636 filed Sep. 27, 2000; Ser. No. 09/653,788 filed Sep. 1, 2000; Ser. No. 09/942,308 filed Aug. 29, 2001; Ser. No. 09/660,743 filed Sep. 13, 2000; Ser. No. 10/726,446 filed Dec. 3, 2003; Ser. No. 10/726,475 filed Dec. 3, 2003; and Ser. No. 10/817,759 filed Dec. 31, 2003 are hereby expressly incorporated by reference herein for all purposes. The instant application contains disclosure that is also contained in copending U.S. Ser. No. 10/840,092, filed May 6, 2004, now pending, the entire contents of which are hereby expressly incorporated by reference for all purposes.

An embodiment of the invention can include a method and/or apparatus for monitoring the status of and tracking the location of shipping containers onboard ship, at the shipping terminal, and during over-the-road (truck and rail) transportation. Thus, the invention can include a true "inter-modal" tracking and monitoring system. This method and/or apparatus can utilize hybrid spread-spectrum (HSS) communications for robust two-way transmission of data to and from the container onboard the ship and in the shipping terminal. The phrase hybrid spread-spectrum (HSS) as used herein is defined as a combination of direct sequence spread-spectrum (DSSS), for example code division multiple access (CDMA), and at least one of frequency hopping, time hopping, time division multiple access (TDMA), orthogonal frequency division multiplexing OFDM and/or spatial division multiple access (SDMA), for instance as described by PCT published application No. WO 02/27992 and/or U.S. Ser. No. 10/817, 759 filed Dec. 31, 2003. Fast HSS is a particularly preferred embodiment where spreading and hopping occurs during a bit time (i.e., each bit is spread and hopped individually). The invention can utilize cellular and/or satellite data transmissions for communications during over-the-road transportation. Sensors for monitoring the container cargo status and condition can be included in this system. The location of the container can be determined using the global positioning system (GPS) during over-the-road transportation, and by using more localized radiolocation techniques utilizing the HSS communication's RF signals. The location and status of a container can be relayed to a national operations center, which combines this data with the cargo manifest in a geographic information system database for monitoring, tracking, managing and displaying container information.

An embodiment of the invention can include a marine asset security and tracking (MAST) system linking robust, long-range RFID technology to GIS-based tracking infrastructure via a global satellite communication network to create a truly global asset management and cargo tracking/visibility system utilizing open systems architecture. The MAST system is intended to provide real-time ship/road/rail container and cargo tracking in the context of an open systems architecture for port and supply chain security needs. This tracking technology will create a number of commercial opportunities, including homeland security, supply chain management, port automation, insurance applications, and potential recovery/ salvage of lost and wayward cargo in the commercial marketplace to fund the expansion and adoption of the system. The MAST system effort will also facilitate the development of new standards and "best management" practices for tracking and security monitoring of containerized cargo and assets.

The invention can be designed to provide real-time asset, container, and cargo tracking for port security/management needs, and increase safety of life and property across intermodal transportation networks. The ability to globally track containers in real-time with internal condition monitoring is essential to securing the supply chain and the port system. The preferred HSS, two-way low-power wireless communications will work well in the context of ship and/or terminal communications distances (e.g., range of 300-500 meters) at a power of approximately 10 mW.

The RF propagation problems in and around closely stacked steel shipping containers dictate the use of extremely robust data-communication techniques (e.g., advanced spread-spectrum modulation and diversity receiving systems) to successfully transmit telemetry signals from the individual container RF tags to the ship receivers (readers). The goal of highly accurate radiolocation of these containers in large, closely packed stacks, especially down in ships' holds, will continue to be elusive unless numerous receivers (readers) are distributed throughout the yard facilities and over the decks and holds of each ship. If some loss of position resolution can be tolerated in normal operation, then in most cases the use of carefully engineered container RF tags and infrastructure components, tailored in their deployment to the specific environment (i.e., yard or ship), should provide effective telemetry of container ID and status data (e.g., door security, temperature) and reasonably accurate container location information (i.e., within one stack position) in the vast majority of specific environmental cases.

A preferred MAST system implementation can use the 2450-2483.5 MHz ISM band to comply with international regulations, particularly for ships being loaded in foreign ports. Further, port facilities overseas will undoubtedly eventually use some sort of RF telemetry for tracking containers. If the MAST system protocol fits the international allocation in the 2.45-GHz ISM band, it may well be adopted worldwide to track shipping containers, first in ports and eventually in other venues such as rail, planes and trucks. For narrowband system alert signals, beacons and the like, other ISM band possibilities include the 13.56 and 433-MHz slots; the 868-MHz (Europe) and 915-MHz (North America) bands provide somewhat more width for higher-rate and spread-spectrum use. The data protocol of a commercial embodiments of the invention is likely to be a hybrid or direct-sequence spread-spectrum signal with fairly wide bandwidths (>1 MHz), long code lengths (e.g., $\geq 63$) for better process gain and jamming resistance, and controlled time slotting for lower collision statistics.

To deploy the MAST system in a marine (yard/ship) environment, several areas of functionality should be combined in a system. The first functional group encompasses the basic architecture for a sea-based system, which includes (1) communication links; (2) antennas; (3) electronics; (4) container-unit power sources; (5) ship-to-shore system interface, e.g., satellite link; (6) container telemetry system integration; (7) container location detection [GPS, optimally augmented by local RF triangulation]; (8) sensors; (9) system central monitoring units; and (10) container database interfaces. The second functional group includes the port container-yard system, which is largely the same in function as the shipboard setup, except that additional system logic is needed to manage the tracking-system handoff between the ship and yard systems.

1. Overview

Referring to FIG. 1, one or more radio frequency identification tags 101 coupled to containers 105 are in bi-directional radio frequency communication with a reader 107 on a ship 110. The ship 110 also includes a site server (not shown in FIG. 1) but is in bi-directional radio frequency communication with a low earth orbit satellite 120. The low earth orbit satellite 120 is in bi-directional radio frequency communication with an earth station 125.

Simultaneously, another radio frequency identification tag 102 and an inter-modal container 106 (carried by a truck chassis) is also in contact with the low earth orbit satellite 120. It is important to note that the radio frequency identification tag 102 can also be (alternatively and/or simultaneously) in communication with a cell tower 130. While the radio frequency identification tag 102 is depicted to be in direct communication with the low earth orbit satellite 120 and/or the cell tower 130, it is important to note that the radio frequency identification tag 102 could relay through a reader and/or a site server located on the truck chassis.

A network operation center 140 is in bi-directional communication with both the earth station 125 and the cell tower 130. The network operation center (NOC) is in-turn downloading data to a plurality of recipients including in this embodiment Customs, the Department of Defense, the National Transportation Safety Board, the Department of Homeland Security, the United States Coast Guard, the Federal Bureau of Investigation and commercial stakeholders.

The marine asset security and tracking (MAST) system, illustrated in FIG. 1, is a wireless (RF)-based communications and sensing/telemetry system for tracking and monitoring maritime industry-standard 20-foot and 40-foot shipping containers, both during loading, unloading, and transfer operations at portside dock facilities, as well as onboard ships during overseas transport of the containers. This system can provide a true inter-modal tracking and monitoring system capable of operating on ships, railroads, aircraft, over-the-road trucks and within their associated terminal facilities, utilizing both local-terminal communications systems and other wide-area commercial communications systems, including satellite and/or cellular/PCS. This RFID tagging system can include RFID tags attached to each shipping container, local site readers located throughout the ship and in the shipping terminal, one central site server on each ship or in each terminal, and a network operations center (NOC) where all data can be collected, consolidated, stored, analyzed and disseminated. The shipping containers can be both refrigerated-cargo shipping containers (reefers) and dry-cargo shipping containers (dry-boxes). In addition to identifying and tracking the location of containers or other equipment fitted with one of the RFID tags, each tag can be equipped with an (e.g., IEEE 1451) sensor interface and optional extra serial interfaces to permit the connection of a wide range of sensors to the RFID tag to monitor the condition of the container cargo or other tagged equipment. Sensors which can be connected to the RFID tag include (but are not limited to) temperature, pressure, relative humidity, accelerometer, radiation, and GPS (global positioning system). Additional sensors can be included for condition monitoring of machinery, such as refrigeration compressors, or to read from the diagnostic data port on some refrigerated cargo containers.

The MAST system has three main operational modes: the first is when the RFID tag is on a ship; the second is when the RFID tag is in a terminal; and the third is when the RFID tag is being transported over-the-road or rail (this includes all times that the RFID tag is not on a ship or in a terminal). A terminal can be considered any local area served by the RF communications system. The RFID tagging system can include: a) the network operations center (NOC), which can include the status and data on all RFID tags and their associated cargo containers (or other asset) and provides this information out to the users; b) the local site servers (one per ship or terminal), which can manage local-area communications (i.e. each ship or terminal) and relay the RFID tag data to a central system server; c) the RFID tag readers, which can receive the communication from the RFID tags in the local area and relay it on to the local site receiver; and d) the RFID tags.

Figure 2:
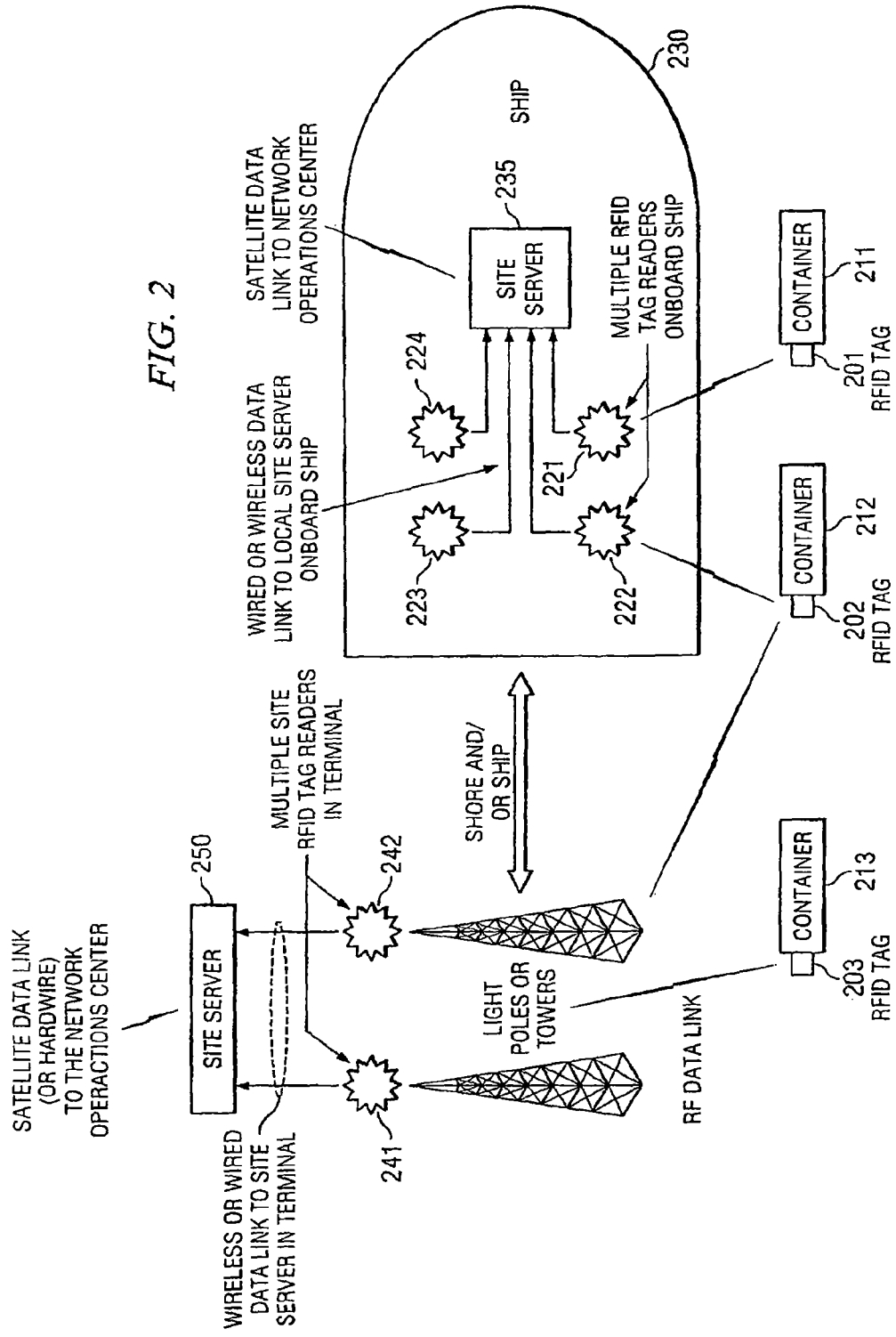
FIG. 2 illustrates a schematic view of a radio frequency RF data link operation for use both onboard ship and in terminal with radio frequency identification (RFID) tags able to communicate with both shore-based and ship-based receivers simultaneously, representing an embodiment of the invention.

Referring to FIG. 2, the shore and/or ship communications flexibility of the invention is depicted. A first radio frequency identification tag 201, coupled to a first container 211, is communicatively coupled to multiple radio frequency identification tag readers 221, 222, 223, 224 located on a ship 230. The multiple radio frequency identification tag readers 221, 222, 223, 224 are communicatively coupled to a site server 235 on the ship 230. The site server 235 is communicatively coupled to a satellite (not shown in FIG. 2) but is in-turn communicatively coupled to the network operation center.

A second radio frequency identification tag 202 coupled to a second container 212 is communicatively coupled to the multiple radio frequency identification tag readers 221, 222, 223, 224 and also simultaneously communicatively coupled to multiple site radio frequency identification tag readers 241, 242 located on light poles or towers in or around a terminal. The multiple site radio frequency identification tag readers 241, 242 are communicatively coupled to a site server 250 associated with the terminal. The site server 250 is communicatively coupled to the network operations center via a satellite data link or other communications circuit (e.g., a hardwire internet connection).

A third radio frequency identification tag 203, coupled to a third container 213, is communicatively coupled to the multiple site radio frequency identification tag readers 241, 242. It is important to note that the third radio frequency identification tag 203 is not depicted as in communication with the multiple radio frequency identification tag readers 221, 222, 223, 224, but could be if their third container 213 were physically moved closer to the ship 230.

Still referring to FIG. 2, the shipboard or terminal communications RFID tags can utilize RF communications to communicate with the RFID tag readers. The preferred RF communications is a hybrid spread-spectrum (HSS) RF data link operating in the 2.45 GHz band. Radiolocation or triangulation of the RF signal from each tag can be utilized to determine the location of each RFID tag.

Figure 3:
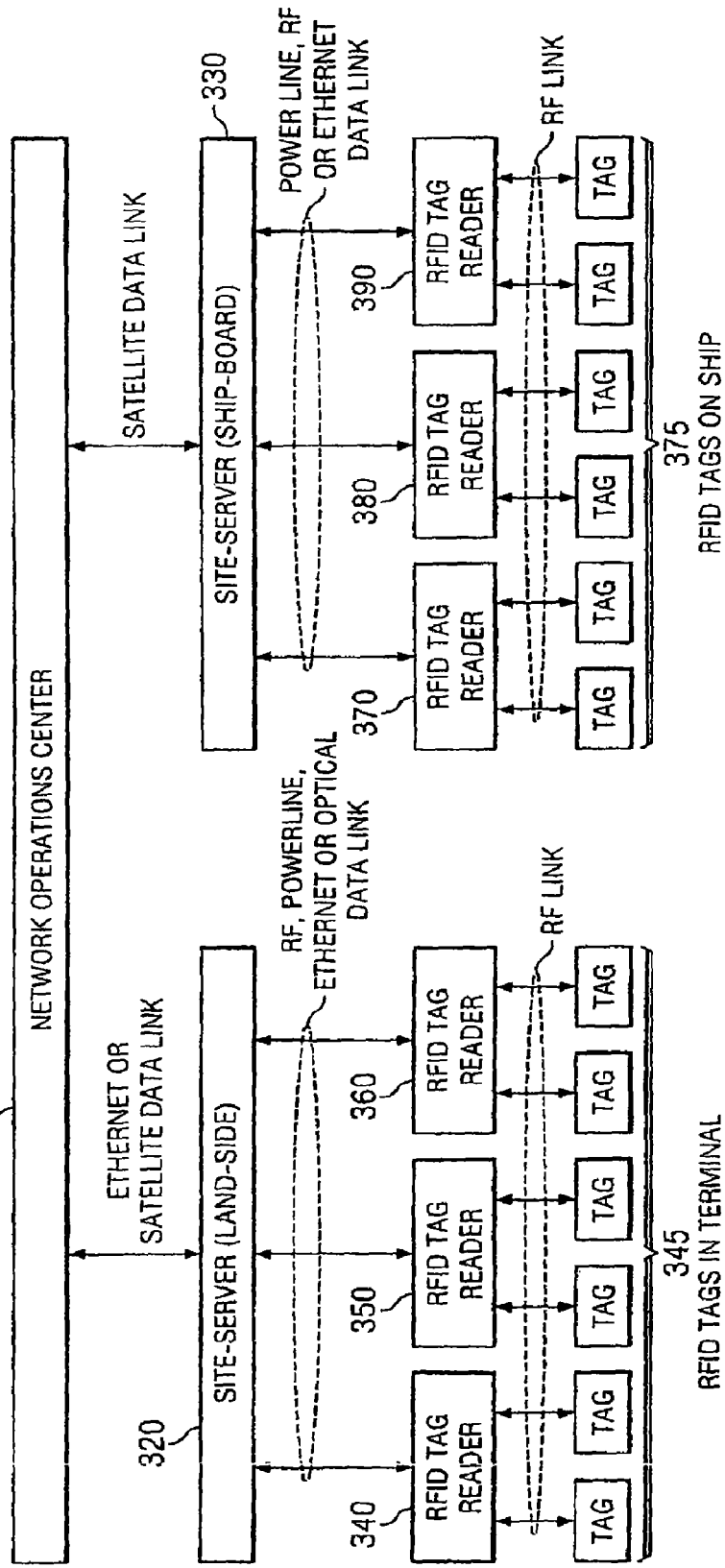
FIG. 3 illustrates a schematic view of communications between RFID tags and a network operations center (NOC) via land-side or ship-board site server when the tags are utilizing RF for local-area communications (e.g., for shipboard and terminal local area (land-side) operations), representing an embodiment of the invention.

Referring to FIG. 3, a network operation center 310 is bi-directionally coupled to a landside site server 320 via an Ethernet or satellite data link. Simultaneously, the network operation center 310 is bi-directionally connected to a shipboard site server 330 via a satellite data link.

The landside site server 320 is bi-directionally coupled to a first radio frequency identification tag reader 340, a second radio frequency identification tag reader 350 and a third radio frequency identification tag reader 360. It is important to note that in this embodiment the communicative coupling between the site server 320 and the three tag readers 340, 350, 360 can be any one or more of radio frequency wireless, power line, Ethernet or optical data link. A plurality of radio frequency identification tags located in the terminal 345 are bi-directionally communicatively coupled to at least one of the three tag readers 340, 350, 360.

The shipboard site server 330 is bi-directionally communicatively coupled to a fourth radio frequency identification tag reader 370, a fifth radio frequency identification tag reader 380 and a sixth radio frequency identification tag reader 390. It is important to note that the shipboard site server 330 is coupled to the three-tag readers 370, 380, 390 through one or more of a power line, a radio frequency wireless or Ethernet data link. A plurality of radio frequency identification tags located on ship 375 are in bi-directional communication with at least one of the three tag readers 370, 380, 390.

As shown in FIG. 3, the RFID tag communications can be picked up by the RFID tag readers and relayed to the local site server by one or more of several possible methods: a) RF data link; b) Ethernet; c) power-line data link; d) optical; and/or e) other(s). Once the tag data is relayed to the local site server, the data can be uploaded to the NOC by either a satellite-based data link or other internet service provider link (e.g., Ethernet). The local site servers may also generate reports for use by local personnel, such as the engineers on the ships. Once the data is uploaded to the NOC, the NOC can communicate back to the tag instructions, verifications and/or queries. The data for any specific container can be made available to any user world-wide with internet access and the proper security validation.

Referring to FIG. 4, a network operation center 410 is coupled to a first cellular or satellite system 420, a second cellular or satellite system 430 and a third satellite or cellular system 440. The bi-directional communicative couplings between the network operation center 410 and the systems 420, 430, 440 can be via a phone line or a base station connection. Each of the three systems 420, 430, 440 is associated with a subset of a plurality of radio frequency identification tags outside of local area (RF coverage) zone 450. The bi-directional communicative coupling between the three systems 420, 430, 440 with their respective subset of the RFID tags outside of local-area zone 450 can be via a cellular or satellite data link.

For over-the-road and rail communications, as illustrated in FIG. 4, the RFID tags can communicate to the NOC by cellular or satellite data links. The preferred method is direct satellite communications, since cellular will not give world-wide coverage. The satellite or cellular system can relay the RFID tag data to the NOC through a base station (satellite) connected to the NOC or through a modem bank (cellular) connected to the NOC. Over-the-road operation can include all operations when the RFID tag is not onboard a ship or in a terminal (any local area served by the RF communications system). A GPS receiver in each tag can be utilized during over-the-road transportation to track the movement of and the location of the container. It is preferred that the containers are not stacked during over-the-road operation. If a tagged container is stacked with another container on top of it, as is possible on some rail cars, the satellite or cellular modem data links and the GPS system may not function. It is possible for another tagged container on the top of a stack to act as a repeater or relay (extender) for the first container. In more detail, the first container can utilize the HSS RF communications when its other methods fail. The second container can receive these communications with its HSS RF receiver and then relay them to the NOC utilizing its satellite or cellular modem data link.

2. RFID Tag Description

Figure 5:
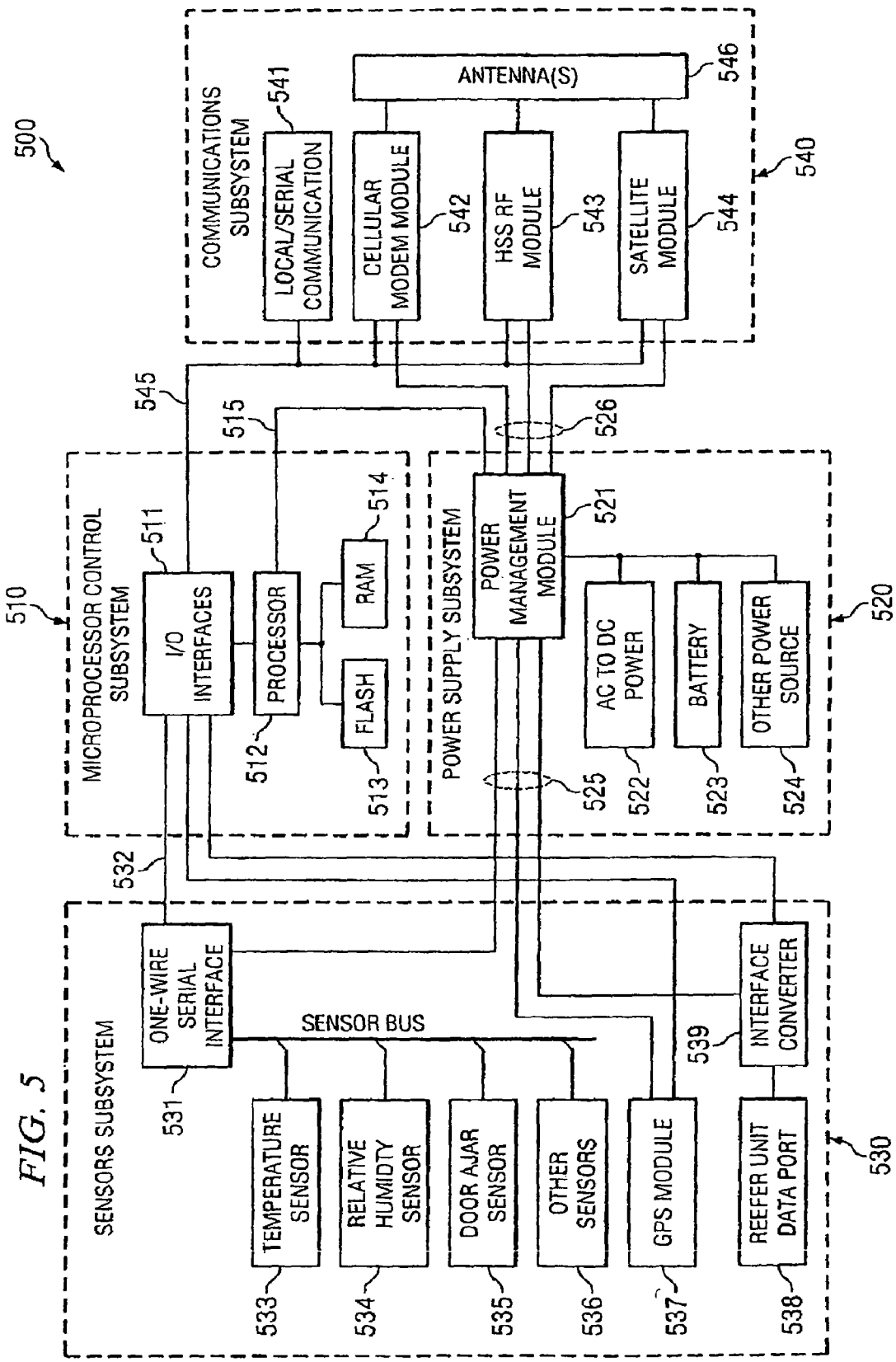
FIG. 5 illustrates a schematic block diagram of the functional components comprising an RFID tag, representing an embodiment of the invention.

Each RFID tag can include four main functional blocks; (1) a microprocessor control subsystem; (2) a sensor subsystem; (3) a communications subsystem; and (4) a power supply subsystem. FIG. 5 shows a block diagram of an RFID tag.

Referring to FIG. 5, a radio frequency identification tag 500 includes a microprocessor control subsystem 510, a power supply subsystem 520, a sensors subsystem 530 and a communications subsystem 540. The microprocessor control subsystem 510 includes an input/output interfaces circuit 511. A microprocessor circuit 512 is coupled to the input/output interfaces circuit 511. A flash memory circuit 513 is coupled to the microprocessor circuit 512. A random access memory circuit 514 is also coupled to the microprocessor circuit 512. The microprocessor circuit 512 is coupled to the power supply subsystem 520 via a power line 515.

The power supply subsystem 520 includes a power management module circuit 521. An AC to DC power circuit 522 is coupled to the power management module 521. A battery 523 (e.g., lithium ion) is coupled to the power management module 521. An alternative power source 524 is coupled to the power management module 521. The power supply subsystem 520 provides power to the sensors subsystem 530 through a set of power lines 525. The power supply subsystem 520 provides power to the communications subsystem 540 through a set of power lines 526.

The sensors subsystem 530 includes a serial interface 531 coupled to the input/output interface circuit 511 of the microprocessor control subsystem 510 through line 532. A temperature sensor 533 is coupled to the serial interface 531. A relative humidity sensor 534 is coupled to the serial interface 531. A door ajar sensor 535 is coupled to the serial interface 531. Other sensors 536 (e.g., ionizing radiation sensors) are coupled to the serial interface 531. The sensors subsystem 530 includes a GPS module 537 coupled to the input/output interface circuit 511 of the microprocessor control subsystem 510. The sensors subsystem 530 includes a refer unit data port 538 coupled to the input/output interface circuit 511 of the microprocessor control subsystem 510 via an interface converter circuit 539.

The communications subsystem 540 includes a local/serial communication circuit 541, a cellular modem module 542, a hybrid spread-spectrum radio frequency module 543 and a satellite module 544, all of which are coupled to input/output interface circuit 511 of the microprocessor control subsystem 510 through line 545. One or more antennas 546 are coupled to the cellular modem module 542, the hybrid spread-spectrum radio frequency module 543 and/or the satellite module 544.

Microprocessor Control Subsystem: The microprocessor control subsystem can operate as the controller for the RFID tag. It can interface with the communications modules, with the sensor modules, and the power modules. The microprocessor can utilize both non-volatile and volatile memory to store the system software, system commands, and sensor data.

Sensor Subsystem: The sensor subsystem can utilize IEEE 1451-compliant protocols for communicating with one or more sensor modules. This allows the future addition of any sensor as long as it is compliant with the 1451 protocol. Some of the basic sensors, such as the GPS and the reefer data port reader, may utilize serial communications ports on the microprocessor. Sensor types that may be part of the RFID tag can include temperature, relative humidity, radiation, biological, chemical, accelerometer, door switch, intrusion, etc.

Communications Subsystem: The communications subsystem can allow multiple different types of communication's links to be incorporated into the tag platform. They may connect through, for example, a serial port or an Ethernet port.

The basic communication's modes can be as follows:

RF Communications—the RF communications can take the form of any number of available wireless communications protocols. However, the preferred method is a hybrid spread-spectrum protocol. This protocol provides higher reliability, lower power, and more robust communications than other wireless techniques. The RF communications can be intended for use primarily when the tags are located on a ship or in terminal (local-area communications).

Cellular/PCS Communications—standard commercial cellular analog or digital modems, such as CDMA or GSM, can be utilized by the tag for over-the-road (truck or rail transportation) communications. However, there is not a standard cellular infrastructure installed worldwide. Therefore, each tag could require several different protocols to be able to operate in more than just a limited market area. In addition, the tags are likely to travel through areas that have no cellular coverage.

Satellite Communications—utilize a satellite-based communications network to provide an over-the-road communications link that can function anywhere in the world. This provides simpler, more robust, and more secure communications system as an alternative to, or in addition to the cellular system. A preferred embodiment can use a Low-Earth Orbit (LEO) satellite network system.

Local Communications—Each tag can have a serial port used for development, troubleshooting, and/or initial setup. The serial port may take the form of, for example, RS232, USB or IrDA (infrared).

Power Supply Subsystem: The power supply subsystem can provide power to all the other subsystems. The sources of power that may be utilized include battery, AC power (e.g., from the refrigeration power supply on reefers) and other power scavenging and/or generating devices such as a photovoltaic, a vibrational transducer, an electrostatic charger, a radio frequency power rectifier, a thermo-electric generator and/or a radioisotope decay energy recovery device. For RFID tags located on assets other than containers, DC power from the assets electrical system may also be utilized. The power supply subsystem can convert the voltage of the power source to the required voltage for each subsystem. It also can perform power management functions to monitor battery condition and power source availability.

3. RFID Tag Reader

The RFID tag readers relay the RFID tags' communications to (and from) the site server. The RFID tag readers can be similar to RFID tags, but with different communications modules, and optionally no sensors. The RFID tag readers can communicate with the RFID tags through a local RF communications module (preferably using the HSS protocol). The RFID tag readers can communicate with the site servers by one of several possible techniques: wireless RF communications (preferably the HSS communications at a frequency other than the RFID tag communications, such as for example at 5.8 GHz), wired communications (such as power-line communications, Ethernet or serial), and/or optical communications (such as by fiber optic or line-of-sight laser communications).

Referring to FIG. 6, a plurality of inter-modal shipping containers 610 are stacked in a two-tier high array. Each of the inter-modal shipping containers 610 includes a radio frequency identification tag 620. A plurality of tag readers 630 are located at the ends of open aisles defined by the two-tier high array.

Another optional feature of the MAST system is the use of "hand-held (portable) readers" for reading the RFID tag data and cargo manifest directly from the container. The hand-held reader can be used by Customs, Coast Guard, shippers, or other certified groups to ascertain the contents of a container and its cargo status (sensor data, movement history etc.). The hand-held reader can be located and then operated near the container. The appropriate identifying code (or perhaps bar code) can be entered into the hand-held reader, and then RF communications used for the hand-held reader to communicate with the RFID tag. The RF communications can preferably utilize the HSS communications utilized for the local terminal and ship communications. The RFID tag would then download to the hand-held reader the container manifest (from the manifest stored on the RFID tag or downloaded from the NOC via a uplinked request from the RFID tag) and a trip log of the container sensor(s). This trip log could contain history reports for all sensors, any sensor alarms (including container instrusions, temperature excursions, etc.), and a history of the container's specific geographic route.

The hand-held readers can also be used to upload a container's cargo manifest (this could also be done by using a portal). As the container is loaded, bar codes or other types of packaging-type RFID tags can be read into the hand-held reader. From the hand-held reader (or other type of RFID reader), the cargo identifiers can be loaded into the container manifest on the container's RFID tag and then uploaded to the NOC.

An alternate approach would be to utilize an IrDA (infrared) data port on the container. The hand-held reader would then be pointed at the IrDA port and communications established. The data download would then be the same as above.

4. Site Server

The site servers can receive the RFID tags' data from the RFID tag readers. The site servers can send the RFID tag data to the NOC. The site server can also perform local analysis of the RFID tags' data and manage the multi-access aspect of the invention that allows for tens of thousands of tags to be in a terminal or on a ship. The site servers can include three main subsystems: (1) a computer-based server and system controller; (2) an RFID tag reader communications subsystem which includes the same communications modules as the RFID tag readers for communicating with the RFID tag readers [i.e., the can have wireless RF communications (preferably the HSS communications at a frequency other than the RFID tag communications, such as at 5.8 GHz), wired communications (such as power-line communications, Ethernet or serial), or optical communications (such as by fiber optic or line-of-sight laser communications)]; and (3) a NOC communications subsystem which can utilize hardwired, cellular, optical or satellite communications modules.

5. Network Operations Center

The Network Operations Center (NOC) can be the information center for a world-wide Maritime Transportation Control System. All RFID tag data from all RFID tags located around the world can be relayed to the NOC by the local site servers or via direct cellular or satellite communications. The NOC collects, stores and disseminates RFID tag data, including location, sensor data, and RFID tag status.

The invention can include the merging of technologies in a central operations center architecture including: global positioning systems; radio frequency identification (RFID) based tracking system for assets and cargo containers; globally available commercial satellite and Internet communication systems; geographic information systems (GIS) and real-time logistical analysis capabilities; fault-tolerant systems to provide hardened continuous data flow to private sector asset and cargo owners, relevant state and federal governmental entities (Coast Guard, TSA, Customs, NTSB, and DoD, etc.), and local first response stakeholders (law enforcement, fire departments, local government); and existing federal systems and commercial programs for asset and cargo tracking.

The use of a geographic information system (GIS) in the NOC will allow for the analysis and presentation of asset location in a variety of formats from simple web-browser based Latitude/Longitude reports to map-based city/state/zip/country information. This system can provide the ability to monitor and profile assets in real-time based on criteria specified including geographic patterns. This approach also provides for the incorporation of real-time logistical analysis regarding the movement of assets. The long-term goal of the GIS development is to create an information infrastructure capable of analyzing the movement of commodities and assets throughout the supply chain and intelligently profile containers including geographic patterns.

The RFID tag data can be integrated to a centralized GIS-based tracking infrastructure via a global satellite communication network to create the MAST system. A preferred embodiment of the MAST system invention utilizes one or more global satellite networks.

Satellite networks provide the ability to track and monitor assets globally in real-time with the ability to concentrate all the information effectively in one location. This provides advantages for security, fault-tolerance, data back-up/archiving, and maintenance. The NOC can integrate the geographic information systems (GIS) technology, satellite communications, global positioning systems, RFID (electronic seals, etc.), and the Internet in an open systems architecture to create a real-time tracking and asset management system. The NOC can provide one single location for real-time logistical support for the global management of mobile assets using a web-based tracking system that will allow individuals or organizations to manage assets in real-time via the Internet with strict information protection protocols (e.g., login and/or encryption). The information can be distributed to relevant parties through secure transactions on a need-to-know basis thus precluding the use of the system to target assets for theft.

The NOC can have one or more of the following resultant operational capabilities: 1) real-time, global ship location tracking with detailed history of passage; 2) tracking container location and condition with tampering notification and internal environmental and radiation status; 3) early warning/threat identification of ships and containers arrival in US waters and ports with an audit trail that identifies potential threats, risks, and responsibilities; 4) detecting and monitoring suspicious shipping activities (unscheduled port calls, etc.) and identify long-term patterns of activity at both ship and container level; 5) secure data to (and/or from) the Department of Defense, US Coast Guard, US Customs, Department of Homeland Security, as well as local "first response" law enforcement agencies for homeland security, port security, smuggling, and theft concerns; 6) secure data to (and/or from) shippers and ports to plan and manage cargo arrival and distribution on an as-needed basis; 7) system for comprehensive port, ship, and container management and "fast-track" protocols for Customs inspection; 8) real-time monitoring capability for refrigerated, critical, and HAZMAT cargo; 9) remote control tower(s) for marine industry to maximize efficiency and central point of contact for important information (e.g., rules, regulations, weather notices, notices to mariners, etc.); and 10) integrate intermodal warehousing, port, ship, road, and rail supply chain management and security applications on a global scale.

6. Multiple-Access

The multiple access approach described herein enables a multiple access network that can operationally accommodate roughly 10,000 RFID tags spread over a terminal or ship located in an environment that may include upwards of 90,000 additional RFID tags (potential interference sources) located in/on nearby terminals or ships. This multiple-access design can utilize one or more of CDMA, FDMA, TDMA and/or SDMA (spatial division multiple access) to achieve these requirements. The RFID tags can each report electronic identification codes, sensor data, and location information to an array of RFID tag readers that form either a perimeter around or a grid throughout the terminal or ship. The RFID tag reader locations may utilize the existing infrastructure of lighting towers that are currently in the yards. These RFID tag readers can coordinate the data from the tags and report all useful data to a nearby site server. The site server can then relay significant events and sensor data to the NOC. A description will follow of the terminal/ship area communications with a focus on the RFID tag to RFID tag reader links.

General Strategy

The following describes elements of a preferred overall communications strategy. An embodiment of the invention can include a combination of Code-Division Multiple Access (CDMA) utilizing both Direct Sequence Spread-Spectrum (DSSS) and Frequency-Hopping Spread-spectrum (FHSS), Time-Division Multiple Access (TDMA) and Spatial-Division Multiple Access (SDMA) can be used for the tag-to-reader link. An embodiment of the invention can include a reader-to-server link utilizing a different frequency band (e.g. 5 GHz). An embodiment of the invention can include bi-directional communications that can enable power control to be employed to optimize CDMA and SDMA methods. An embodiment of the invention can include independent terminals (yards) in close proximity being given distinguishable groups of spreading codes from proximate neighboring yards. An embodiment of the invention can include an option of sub-dividing yard into micro-cells.

The following describes key performance parameters of the above described preferred overall communications strategy. A site server can receive updates from 10,000 proximate tags at least once every 100 seconds with 99.99% probability of success. The network that includes the site server can have the ability to "ignore" up to 90,000 semi-proximate tags. High-priority message(s) from the tag(s) can be sent within 1 second of delay.

Implementation

The following implementation analysis includes the following assumptions. One thousand bits are used from each node once every 100 seconds. Offset-Quadrature Phase-Shift Keying (OQPSK) modulation with a 5 MHz bandwidth and nearly constant-envelope signals is used. Sixteen or more non-overlapping hop frequencies with managed overlap fraction. Length-63 spreading codes for Direct Sequence are used.

Based on the above explicit assumptions, the 1000 bit (125 byte) packets will be transmitted once every 100 seconds from each of the 10,000 nodes at a bit rate of 80 kbps with a chipping length of 63. Thus, the embodiment of the invention has a chipping rate of about 2.5 Mbps which translates to a spectral bandwidth of about 5 MHz with OQPSK modulation. It is assumed that the RFID tag readers will need to communicate with each RFID tag about once every 100 seconds. Therefore, 10,000 RFID tags translates to an average of 20,000 packets every 100 seconds. These 20,000 packets will be multiplexed into 4000 time slots (25 ms long) and a 32 CDMA users (combination of 63 length codes with 16 hops—assuming the maximum simultaneous users is approximately square root of chip length times square root number of hops.)

The perimeter RFID tag readers can use directional antennas aimed between rows of containers for RFID tag communications. Directional antennas operating in a different frequency band (e.g. 5 GHz) [or alternatively, power-line communications] may be used for tower-to-tower/server communications. Depending upon yard size and other environmental parameters, the towers may also be required to provide relayed communications.

The main functions of the RFID tag readers can be to capture information from all of the RFID tags and then relay this information to the site server. They may coordinate with each other in a fashion that optimizes the multiple access plan for upwards of 10K tags, or they may only communicate directly to the site server. For example, if several readers are capturing the data from a single RFID tag, then the readers can cooperatively determine the lowest power level at which at least one reader can reliably communicate with the RIFD tag.

Power Control

As mentioned above, power control can be used to optimize the network communications. Of course, power control is desirable to a great extent by the use of DS-CDMA. This multiple access approach can include protocols for network discovery, power back-off, and interference mitigation techniques that all involve controlling the transmitted power from the RFID tag.

Re-Transmission Redundancy

The above analysis assumes that the system needs to hear from every RFID tag at a rate of once every 100 seconds and that about 1000-bit messages are sufficient. This includes a conservative estimate for inter-packet guard time of 100% of packet length. In the above example, packets would be approximately 12.5 ms long and the average guard time would be about 12.5 ms also. This guard time is very conservative and can probably be reduced by upwards of 90%, thus enabling almost another doubling of the throughput or redundancy. A subsection of the guard time is to be used for "emergency" events in a CSMA fashion. Furthermore, most applications will not require 100-second update rates; therefore, successive time slots during the next 100-second cycle can be used to re-transmit bad packets. For instance, an update rates of once an hour, or every second or even third hour could be sufficient for most applications.

In order to perform power control as discussed above and to carry out the typical duties of channel assignment and network optimization, a strict flow control should be established for the boot-up sequence of all nodes. This following description in conjunction with FIGS. 7-8 (flow charts) present a design example of that process.

Discovery Process

Figure 7:
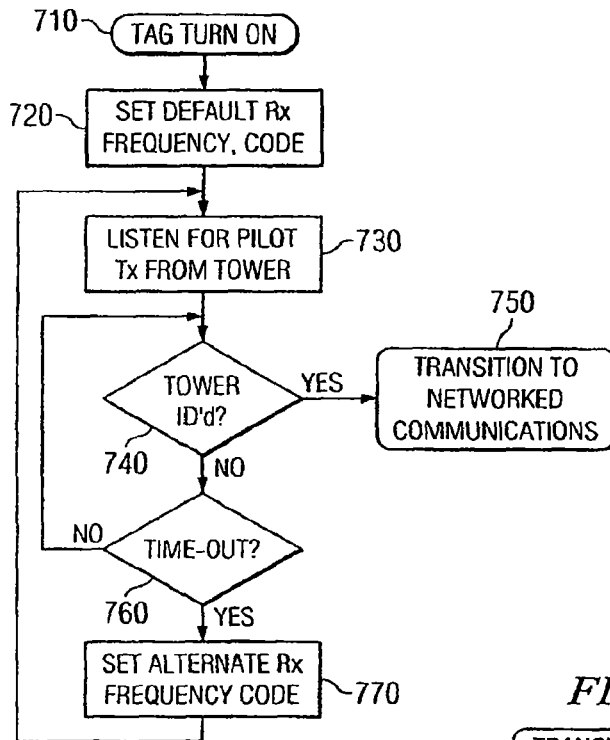
FIG. 7 illustrates a flow diagram of a RFID tag boot-up sequence—including a node discovery sequence mode that can be implemented by a computer program, representing an embodiment of the invention.

As shown in FIG. 7, the nodes will boot-up on a system control (default) RF channel. The nodes will cycle through a small set of "pilot" channels until they establish a link with one of the RFID tag readers. This loop is necessarily endless until or unless successful communication is established with a reader (or another tag if an alternative tag-to-tag approach is available in a given system). An embodiment of the invention can include stepping the power up and/or during this process.

Referring to FIG. 7, an exemplarily tag boot-up sequence can begin with a tag turn on step 710. At step 720, the tag sets a default receiver code. At step 730, the tag listens for a pilot transmission signal from a tower. At step 740, if a signal from a tower is identified, then the tag proceeds to a transmission-to-network communications 750. If a tower is not identified, then the tag determines whether a time-out period has elapsed at step 760. If the time-out period has not elapsed, then the tag continues to attempt to identify a tower. If the time-out period has elapsed, then the tag proceeds to a step 770 including setting alternative receiver frequency codes. After setting an alternative receiver frequency code, the tag then proceeds to step 730 and again listens for a pilot transmission from a tower.

During the discovery process, it can be desirable to minimize the number of tags transmitting at a given time. This can be accomplished by having the reader node control the discovery process. The reader will send out an ID Request that prompts all tags within its range to transmit in a given order on a given temporary code (see Network ID Transmit Order below). Then the reader will start receiving and processing messages from the tags. After the first cycle of node identification is completed, the reader will send a message to the tags acknowledging receipt and assigning both a network ID and a time slot allocation for the tag. The cycle will be repeated, with the qualification that all tags having network ID assignments (associated with that reader ID) will not acknowledge the ID Request message. The invention can include protocol for resolving conflicts, etc.

Network ID Transmit Order

The reader can request that all tags that are able to decode its ID Request (and which have not been previously logged by that reader) transmit a 5-ms message x times 10 ms after receipt of the request where x is the 3 least significant digits of the tags UUID. (For instance, a tag having a UUID of 12345678 could wait 6,780 ms before transmitting to the reader.) In addition, the tag can use the next 2 higher digits (in this example 45) to select a combination of FH and DS codes. Thus, a reader should be capable of handling 100,000 tags unambiguously.

Once the RFID tag and the RFID Tag Reader have established a link, the reader will assign the RFID tag a code and frequency combination that makes it part of an optimized network. This process is shown in FIG. 8.

Figure 8:
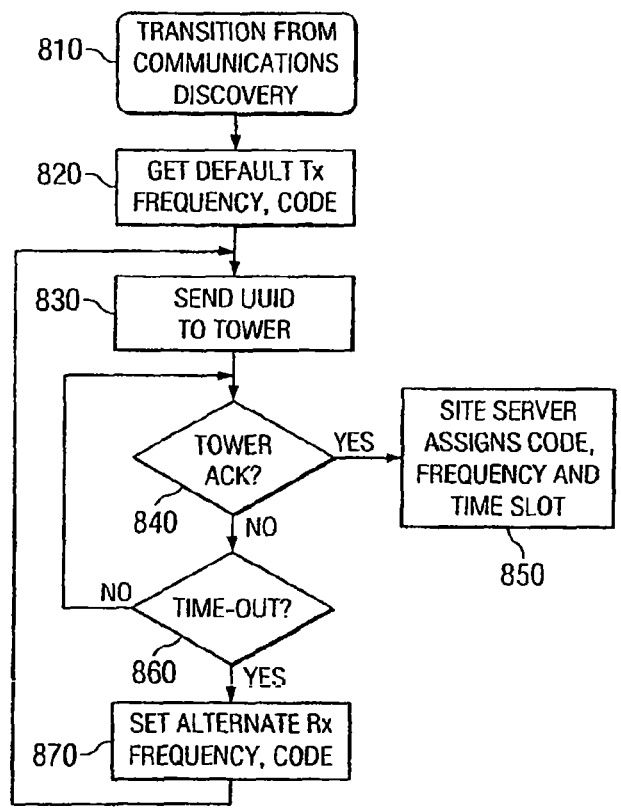
FIG. 8 illustrates a flow diagram of a RFID tag boot-up sequence mode that can be implemented by a computer program, representing an embodiment of the invention.

Referring to FIG. 8, upon a transmission from communications discovery 810, the tag obtains or adopts a default transmission frequency code at step 820. At step 830, the tag sends the default transmission frequency code to the tower. At step 840, if the tower acknowledges the default transmission frequency code, then the site server will assign to the tag a code frequency and time slot at step 850. If the tower does not acknowledge at step 840, then the tag will proceed to step 860 where it determines whether a time-out period has elapsed. If the time-out period has not elapsed, then the tag returns to step 840 and will continue to await acknowledgement from the tower. If the time-out period has elapsed at step 860, then the tag will proceed to a step 870 where an alternative transmission frequency code will be obtained or adopted. The tag then proceeds back to step 830.

Packet Structure

This section focuses on the portions of the packet dedicated to ensuring robust communications such as the preamble and error correction/detection coding. The payload of the packet can be any useful payload (e.g., identity, location, dosimetric, etc.).

Since the preferred waveform utilizes frequency hopping as well as direct sequence spread-spectrum, the preamble can have two portions: a 64-bit constant frequency DSSS portion and then a 63-bit hybrid FH/DSSS portion. The receiver correlator can search the beginning of the transmitted waveform for autocorrelation peaks on a known frequency. Once the receiver has derived the location (in time) of the "bit" edges, it can start hopping its carrier frequency. The transmitted waveform can start hopping at the start of the second portion of the preamble that can act as a data delimiter word. The receiver can re-establish synchronization with the hopping sequence at the start of this second (63-bit) sequence. This allows the receiver to miss upwards of 5 bits of the sequence and still successfully find the start of the data payload. A CRC word 32 bits in length will complete the packet and can be used to ensure the integrity of the actual data payload.

Direct Sequence Spread-Spectrum

The DSSS assignments can be chosen from a Kasami code generator that produces about 520 codes of length 63. Only about 32 codes can be in use within a given cell, within a given time slot. However, utilization of this large set of codes makes the code assignment processes easier to manage.

Frequency Hopping Spread-Spectrum

During any given packet slot, some of the channel orthogonality can be achieved via frequency hopping assignments. Since the assumed RF tag spectrum is about 5 MHz and the Industrial, Scientific, and Medical (ISM) band at 2.45 GHz is 80 MHz, only 16 hopping center frequencies would in this example be utilized. While hybrid spread-spectrum is preferred primarily to improve the robustness of individual links exposed to a harsh multi-path environment, it can also be advantageously utilized to increase the number of simultaneous users occupying a time slot. If timing synchronization for this system in a particular implementation is not sufficient to support the high-speed hopping scheme, then the DSSS spread-spectrum alone can be used for distinguishing multiple simultaneous users.

7. Marine Systems Observations and Analysis

The size of the ship terminal facility will strongly affect the configuration of the shore-side RF system (i.e., number and distribution of receivers) required to track containers throughout this facility expanse. The light poles at a terminal are preferred locations for facility receivers and transmitters (or transceivers).

Shipboard RF container-monitoring receiver(s) could be sited on the mast at the ship's bow end. It is important to note that containers are not always stacked to a uniform height on deck or in a very consistent distribution. RF propagation into or out of covered holds (steel hatches) may be essentially nil; therefore, it may be necessary to provide RF system receiver(s) inside the holds to facilitate monitoring of containers there.

In a loaded ship, containers are often stacked above-deck right up to the edges of the hull. The bridge wings and masts, can be used for mounting RF infrastructure components for the MAST system. Gaps between each row and stack of containers can permit an RF signal of suitable wavelength to bounce back and forth before finally reaching the edge of the ship. It can be desirable to place a system antenna at each end of this space, along the periphery of the ship, to achieve consistent coverage of all the containers above deck.

Containers are typically stacked tightly in the hold. The containers slide down vertical retaining rails attached to the ship's structure. The metal bulkheads effectively compartmentalize the areas around the ends of the containers, further hindering RF propagation from the containers within the hold. Once the hatch is placed over the hold, a fairly good Faraday cage is formed and very little RF can enter or leave. Therefore, it may be necessary to install some in-hold RF infrastructure (i.e., receivers and associated data links back to the central monitoring station on the ship's bridge) if near-real-time (e.g., daily) telemetry is required from containers stacked down in the holds. The container locking mechanism ensures a 2- to 3-in. gap between the tops and bottoms of the stacked containers. The roughly 2- to 3-in. space between the tops and bottoms of containers should be sufficient to provide an RF path (at suitable frequencies) between the containers. The corresponding space between the sides of the containers typically varies from 0.5 in. to about 2 in. This arrangement can create an ohmic (lossy) and/or capacitive connection at radio frequencies between the containers, which may somewhat impair the signal propagation out of the stack.

Figure 9:
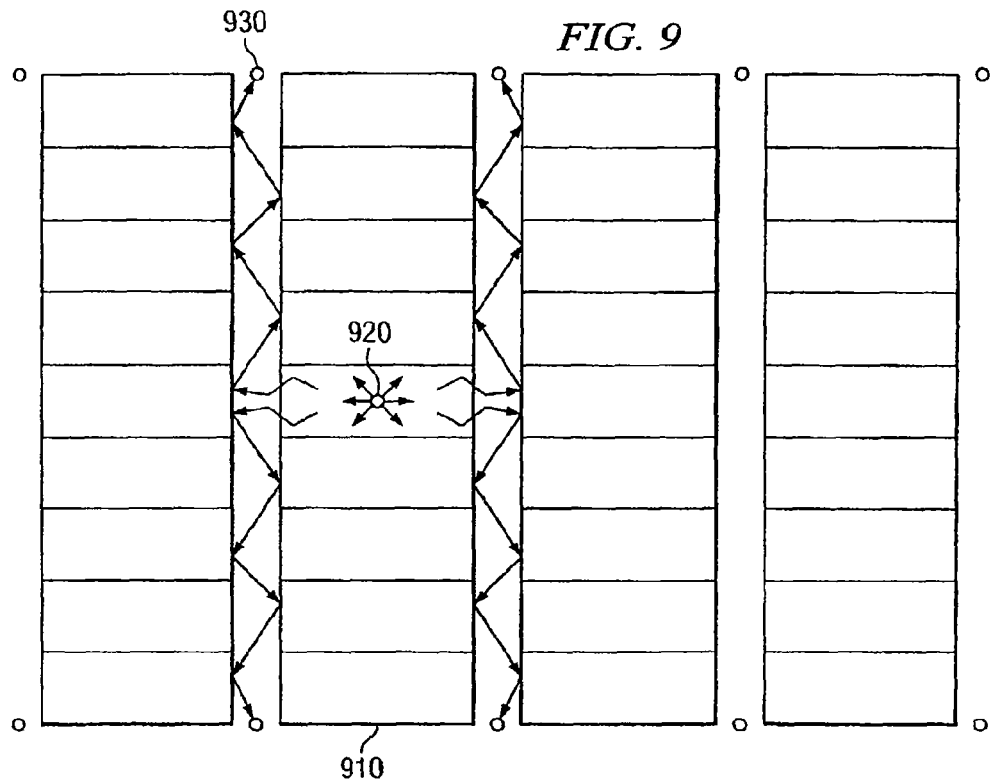
FIG. 9 illustrates a schematic top plan-view of a group of tightly stacked containers (nominally 40-footers) on the deck of a ship or within a terminal yard, with a single RF emitter (depicted as a radiating dot) mounted near the center of the top of its host container; the arrows denote RF energy leaking from the ends of the container into adjacent aisles and then reflecting along the aisles; and potential RF receiving locations are denoted by the dots located at the ends of the aisles, representing an embodiment of the invention.

Referring to FIG. 9, a plurality of inter-modal shipping containers 910 are arranged in an orthogonal array. A radio frequency identification tag 920 is depicted on the top of one of the inter-modal shipping containers 910. A plurality of readers 930 are located at the ends of the aisles formed by the plurality of multi-modal shipping containers 910.

FIG. 9 depicts a plan-view of a group of tightly stacked containers (nominally 40-footers) as they might be arranged on the deck of a ship or on the ground within a terminal yard. A single RF emitter (represented by a radiating red dot in the diagram) can be mounted near the center of the top of a container. Because the containers' undercarriages and top side rails tend to channel the signal lengthwise, most of the RF energy will leak out of the two ends of the container into the adjacent aisles in both directions (up and down on the diagram). These signals will bounce between the ends of the containers bounding the aisle until they emerge at the edges of the array, suffering moderate losses and significant waveshape distortion. Fairly wideband (i.e., several-MHz) spread-spectrum signals with high immunity to scattering and multipath-type distortions are likely to be received best. Of course, the invention is not limited to any particular contextual configuration.

Potential RF receiving and/or transmitting locations are denoted in FIG. 9 by dots at the ends of the aisles. Although each dot could represent a discrete antenna, a more practical, robust configuration might employ short pieces of "leaky coax" cables to span the aisles and standard low-loss coax sections in between. To afford better physical protection, the "leaky" cable could be housed inside sections of heavy-walled PVC pipe, which presents relatively low losses at up to a few GHz in frequency; the standard cables could be run in PVC or even metal conduit for the best crush resistance, since the conventional coax is fully shielded. These receiving and/or transmitting location systems could be mounted (semi) permanently at the ship's periphery, at or near deck levels, and perhaps even on handrails or other convenient structures. There is typically a personnel catwalk between rows of containers on each side of the cargo holds. It is possible to locate RF system antennas for container telemetry links at appropriate spots on catwalk assemblies.

The precise locations and mode(s) for mounting these antenna components will be highly dependent on the detailed specifics of an individual ship's construction. In the case of containers in one of the ship's holds, the leaky-coax cable could be installed along the side wall, in roughly the same vertical plane as the container guide rails. In both instances, the orientation of the leaky-coax cable should be maintained to provide the most efficient energy transfer with respect to the polarization and orientation of the antennas on the containers. For example, for horizontal container RF launchers, the cable should also run approximately horizontally to maintain relatively low coupling losses in the container-to-local-receiver RF links (assuming horizontally polarized container antennas).

Other major system design considerations lie in the selection of appropriate RF operating frequencies. Legal and licensing constraints favor the use of allocated license-free bands such as the current Industrial, Scientific, and Medical (ISM) bands of 13.56, 27.55, 433, 902-928, 2450-2483.5, and 5725-5825 MHz and the so-called Unlicensed National Information Infrastructure (U-NII) bands of 5150-5250 and 5250-5350 MHz in the United States and the rest of North America [and/or similar allocations in other parts of the world]. The first three segments are narrow in width (well under 1 MHz), while the latter five are intended for various forms of spread-spectrum signaling.

Although the narrow bands may support very low-rate data transmission, their capabilities for radiolocation and highly robust links are decidedly limited. On the other hand, the spread-spectrum bands permit significantly higher RF power levels and will support much more resilient modulation techniques. Overall, the 902-928 MHz band will provide the greatest range, but the 2450-2483.5 MHz band is essentially universal and can be utilized (at least in part) throughout the world. There are several emerging RF standards in the general fields of radiolocation and telemetry. The HSS protocol is already explicitly permitted in the ISM and U-NII bands by current Federal Communications Commission rules.

The flexibility of multi-band and/or multi-protocol devices for container tracking can also be used by the invention, although the penalty in tag cost, power efficiency, and complexity can be fairly serious. The invention can utilize highly integrated multiple-band RF devices (including transmitter and receiver electronics, filter structures, and antennas) that are preferred for worldwide versions of the MAST system concept.

An additional consideration is the specific type of RF system architecture required to achieve the desired level of functionality. A bi-directional data-telemetry system will permit a more sophisticated tag-device feature set, including accurate RF-signal power control; remote reprogrammability; individual tag (addressable) queries; multi-tag relay capabilities; ad-hoc dynamic tag-to-tag data routing to overcome RF path blockages and nodes with low-battery conditions; and networking tasks, such as rolling security codes, remote software changes/updates via the network, and node-status inquiries. The overall node power efficiency and energy utilization is also usually optimum with a bi-directional protocol, resulting in the longest possible battery lifetimes and most timely node-alarm reporting and diagnosis capabilities. Of course, the penalty for this type of RFID tag node is increased complexity and cost increase due to the presence of an onboard RF receiver, but the additional acquisition cost may well be more than offset by the increased battery life and, therefore, reduced maintenance interventions by ships' crews or other maintenance/service personnel.

By contrast, the basic unidirectional network comprises autonomous tags that generally operate in a "dumb chirper" mode, in which the tags simply burst their data out to the system infrastructure receiver(s) at predetermined intervals. These transmission intervals may be regular, randomized, slot-randomized, or even altered by the nature of the tag's data. For instance, a highly preferred embodiment is a "smart" tag that would simply omit transmissions of redundant data, instead sending only new, changed readings. A slight modification to this protocol would involve the straight-forward insertion of a few additional transmissions at a selectable interval to reiterate the true data value (in case a change was inadvertently missed) and convey some basic status information to confirm that the node is still operating properly.

A third type of telemetry-system architecture would support the strategic (or even happenstance) mixing of bi-directional and unidirectional tags as dictated by a particular implementation scenario. This format permits significant flexibility in selection of the tag types, though at some cost in overall RF system performance and generally reduced tag battery lives. Although the preceding descriptions are based on nominally single-band network setups, even more flexibility and higher performance can be obtained in a multi-band system, albeit at a significant cost penalty (principally in the total price of all the tags). In all these instances, the use of the HSS technique affords advantages in bit-error rates, loss of packets, collision rates, RF power efficiencies, and apparent interference levels toward other facility RF systems, particularly those sharing the same general bands. An embodiment of the invention can include mixing bi-directional relay tags with "dumb chirper" tags in ones system.

A refrigerated container ("reefer") typically includes a 3-phase power cable that plugs into an above-deck outlet fed from the ship's electrical distribution system. In general, the reefer-monitoring application is particularly important because of the high values of the cooled cargoes (e.g., pharmaceuticals, perishable foods, and medical supplies). The current practice is for ship personnel periodically to manually monitor and record (i.e., with pencil and clipboard) a single internal temperature while at sea; any deviations are reported to the ship's engineering crew. In addition to the internal temperature (perhaps at several spots), additional data such as relative humidity, compressor pressures, coolant flows, electrical supply voltage/current, and container integrity (door breach) can be acquired via automatic monitoring and alarm telemetry. This information could add great economic value to an embodiment of the invention by providing early warnings of refrigeration failures, thereby facilitating rapid repairs and avoiding costly cargo spoilage. This telemetry could be handled via RF techniques, as discussed earlier, or through robust data transport over the ship's ac power system. Even more advanced methods—such as electrical signature analysis can more accurately assess the conditions of operating compressors, fans, pumps, valves, and other motor—and solenoid-driven loads and provide a high level of real-time condition-monitoring capability for critical shipboard equipment.

8. Analysis of RFID Tagging System Communication Requirements

Perhaps the paramount technical issue in the development of a workable RF-based tagging system protocol is the need for highly reliable, robust, low-power RF communication links, particularly between the sensor/ID tags mounted on the containers and the facility or shipboard receiver infrastructure. A telemetry approach using a hybrid (direct-sequence/frequency-hopping) spread-spectrum transmission technique to simultaneously improve RF tag performance markedly (re: data and locational accuracies) and reduce RF interference generation and susceptibility with respect to other tags and facility RF systems is preferably to be used. As noted above, the phrase hybrid spread-spectrum (HSS) as used herein is defined as a combination of direct sequence spread-spectrum (DSSS), for example code division multiple access (CDMA), and at least one of frequency hopping, time hopping, time division multiple access (TDMA), orthogonal frequency division multiplexing OFDM and/or spatial division multiple access (SDMA), for instance as described by PCT published application No. WO 02/27992 and/or U.S. Ser. No. 10/817,759 filed Dec. 31, 2003. Another benefit of this technique is in the area of power utilization—the HSS protocol incorporates features to facilitate power savings by limiting the number of RF transmissions from each tag and concurrently dynamically minimizing collisions with other tags, thus reducing the requirements for tag data messages (e.g., re-transmission(s)) to an (absolute) minimum. Another key system operational issue is that of internal power management for the tag subsystem (i.e., logic, RF circuitry, and sensors).

To maintain useful battery-recharge intervals, both the command-receiving and data-transmitting functions of the RFID tags can be performed on a very low duty-cycle basis, since receive-system power consumption levels often are not very much lower than those of the transmitters. In addition, all data from the smart-tag sensors can be processed to eliminate redundant transmissions altogether. Finally, low-battery warnings can be transmitted as needed (embedded in tag data bursts) to the facility receiver(s) to ensure proper tag operability (i.e., data access and tag location), preferably at all times. Alternative tag-energizing options can include local passive-style powering via an interrogator wand, onboard photovoltaics, or other energy sources. Some of the system protocols described above assume bi-directional transmission to the container tags, but it is feasible to consider unidirectional "dumb-chirper" tags for some system implementations that do not require on-demand tag interrogation capabilities.

Pertinent port (shoreside) facility-system design issues include placement of the distributed transceiver/radiolocation units, internal infrastructure signaling options, and the use of RF repeaters to provide adequate and consistent spatial RF coverage throughout the facility. The basic infrastructure may use twisted-pair wires, coaxial cables, power-line RF transmission techniques, or wireless RF transceivers to transfer data between the facility transceivers and the central container monitoring and control point. Yard RF transceivers will most likely be mounted on existing structures, although such an arrangement will depend largely on the specific setup of the terminal. The corresponding shipboard RF infrastructure will be much more constrained by the layout of the vessel and the limited opportunities for optimally siting the RF equipment for best coverage. Numerous compromises can be accommodated, since the fixed RF gear may need to operate from ship's power and may have to be mounted in locations out of the way of normal shipboard operations and maintenance activities. To this end, it is highly desirable to handle RF infrastructure data communication via the ship's AC power-distribution system; doing so will provide a physically protected path and obviate the need to run additional cabling throughout the ship when retrofitting a system embodiment of the invention into the vessel.

9. Requirements for Container Monitoring and Sensors

Container location tracking can require different solutions for ship transport versus rail and truck transport. Onboard a ship, a GPS-based tag alone may not be viable unless combined with a triangulation function. In more detail, GPS is a line-of-sight location system in which the receiver must be able to "see" three or more satellite sources. Containers buried in stacks on deck or inside a ship's hold will not be able to obtain the required line-of-sight signals to use the GPS satellite sources; adding a local GPS repeater onboard the ship may not solve this problem either. Even if GPS signals of adequate strength are received and repeated, the high levels of local RF multipath reflections in the stacks may cause major uncertainties in the locating accuracies and render the results generally unacceptable. Further, the requirements for extremely low tag operating powers will almost certainly exclude individual GPS receivers even where adequate satellite reception might be possible. The preferred on-board solution includes the use of a local triangulation system. Using a local triangulation system tailored for the local onboard environment can permit the best possible container-location performance. Because of the severe multipath reflections and limited (power-constrained) tag transmitting times, such a system may not in all instances be able to give an exact container position, but rather give just the approximate location, probably within ±1 container up/down, fore/aft, and port/starboard. In a great majority of cases, this level of accuracy should be quite adequate.

For shipboard triangulation, multiple receivers may be required. The lack of line-of-sight propagation from a given container to a fixed central receiver will make a suite of receivers necessary to localize the position of the container transmission for containers stacked above deck. In addition, it will be difficult to localize containers in holds beyond identifying which hold they are in. Because of the overwhelming levels of multipath and obstructions to the RF signal paths, each hold could require up to one receiver and antenna per container, mounted on a bulkhead near the end of each container, to accurately localize the container position within that hold. This is probably beyond the number acceptable for a cost-effective solution with current technology. Further, the incremental value of knowing the exact location of each container in the hold is probably not great, as there is no practical way of accessing most containers once they are stacked into the hold. In any event, the priority of finding a specific container within a hold is certainly lower than that of accurately tracing it through loading and unloading, which has a strong economic effect (because of time) on the overall cargo shipping and transfer process.

A solution to this problem is to deploy smart antenna structures (i.e., multiple interconnected, horizontally polarized wire-type dipole antennas mounted on the walls of the holds, all coupled into common cables with remotely controlled RF PIN-diode switches). This setup would effectively implement a group of scanning antenna arrays for the hold, which could identify a container being loaded into the hold and give its location as it is loaded. The locating function for the specific hold can be triggered by a local container-tag RF interrogation signal (i.e., a burst of coded RF energy at 13.56 MHz or another convenient frequency) which would be passively or semi-passively sensed by the container tags as an "alert" or "wakeup" signal. The containers so interrogated whose codes match the alerting signal (e.g., the last few digits of the container serial ID number) would then each respond in a pseudo-random-timed fashion with an HSS burst signal. The hold receiving subsystem would acquire these signals and relay the results to the main shipboard system for correlation with the full serial numbers in the ship's container manifest database.

Another key part of the MAST system is to track the location of containers at the loading dock or container yard. Given the tremendous volume of containers moving in and out of these facilities, a tracking system capable of telling the facility operator where a particular container is located could be a significant time-saver. Within the yard, a local spread-spectrum RF triangulation system can be used to track the container location. The strategic location of four or more receivers around the yard (more for very large facilities) would provide for dynamically tracking container locations. Additional receiving units would generally be located at the entries and exits of the terminal, where their data can be used to record the entry and departure of containers from the facility. Typical direct line-of-sight communication distances in open yards should be approximately from 300 m to approximately 500 m for tag RF transmission power levels of 10 mW, easily extending to about 1 km for 100 mW tags. Radiolocation accuracies can be well within 1 m for typical (short) tag-read averaging times. In addition, greater position resolution can be obtained if longer averaging times are utilized. A set of radiolocating receivers equipped with adaptive beam-steering antennas would typically be installed on each loading crane to obtain complete telemetry and location data on each container at short range as it is being transferred to or from the ship. This data set is likely to be the most reliable verification to the tracking database system that a particular container has actually moved from yard to ship, or vice versa. A optional feature that can be incorporated into the container-location monitoring software is that of motion detection—whenever a container's position changes by more than an incidental amount (i.e., greater than the system position-uncertainty specification), a security routine can be activated that would then track the container's motion as its ID was compared against active shipping manifests. If the container were moved a significant distance (more than normal yard unstacking/restacking operations would typically entail) but was not scheduled to be transferred, yard personnel would automatically be alerted to a potential misplacement or theft attempt.

In general, GPS container location tracking is theoretically possible for containers with clear line-of-sight to the GPS satellites; but it may not be practical in the terminal yard, particularly in stacks, for the reasons outlined previously with regard to shipboard containers (i.e., light of sufficient line-of-sight reception). The same logic applies to containers being transported by rail or truck.

The invention can also include optional technologies for monitoring or sensing container cargo status including a wide range of sensor devices capable of detecting tampering with a container cargo, container temperature, mechanical shock, radiation, stowaway, or chemical/biological agents. Some of these sensors (e.g., temperature sensors, door switches, accelerometers, bead-type shock sensors) are essentially off-the-shelf devices that need only minor engineering effort to be incorporated into a container monitoring system.

Door-integrity monitoring would use a sensor to indicate if container doors are opened or removed. This sensor probably would be a mechanical or magnetic switch, although other means such as optical, capacitive, or reluctance-measuring devices also could be employed. All these items are off-the-shelf and should be easily deployed at low cost.

Radiation monitoring can be accomplished using a sensor that records the interaction of the radiation with a material, such as a standard thermoluminescent dosimeter (TLD) of the type employed for general employee dosimetry monitoring. Analysis of the radiation-induced changes in the material over several days could detect even very low levels of radiation. This sensor would not require continuous battery power, but only battery power to intermittently measure the alteration in the sensing medium. TLDs are off-the-shelf items, and reasonably inexpensive automated reader units are commercially available, but the container application will probably dictate a moderate optimization-engineering effort. To provide continuous, in-container radiation sensing, a number of methods are available at moderate cost, depending on whether the measurement of alpha, beta, gamma, X-ray, and/or neutron emissions is desired, and at what sensitivity levels. For large-scale applications, the invention can include inexpensive multilayer detector materials that can respond to small radiation fluxes with low-level photocurrents readable by low-power CMOS electrometer circuitry (similar to inexpensive home smoke detectors). Radiation monitoring can also be accomplished using the passive integrating ionizing radiation sensors described in detail below.

An alternative strategy for rapid, wide-scale radiation screening of containers would probably best be implemented via a sensitive multi-detector arrayed scanning system mounted on the loading crane or within the shore facility. However, because of the extreme economic time pressure in loading/unloading operations, such container scans must be conducted on the fly or else offline before (or just after) the crane-transfer operation to avoid impacting the overall container throughput rate.

Monitoring for stowaways within containers can be accomplished with several types of sensors. The invention can include the use of a heartbeat detector, known as the Enclosed-Space Detection System. This sensor system, including a vibration probe (e.g., accelerometer) and detection and recognition electronics, can periodically record micro-vibrations in the container and analyze them via wavelet-transform methods for the time/frequency signal signatures characteristic of human (or animal) heartbeats. This system is most effective for monitoring single, isolated containers (e.g., within the dock-yard) but could even be adapted for on-ship use. Another potential method of detecting stowaways or other unauthorized items inserted into containers would be a device to generate a specific electromagnetic field pulse inside (or into) the container. The field levels at two or more locations would then be detected, telemetered out, and recorded. Periodic re-sending of the electromagnetic field pulse and comparison of the new and the original responses would reveal any significant changes in the field patterns dictated by the distribution of material within the container. This, in turn, would indicate movement of the material within the container due to either cargo shifting or the presence of humans (or animals). Although the technology is available commercially, more conventional (and probably less expensive) approaches to this problem include simpler but less-sensitive steady-state or pulsed ultrasonic and/or RF (microwave) systems similar in function to commercial intrusion alarms. The latter technologies are fundamentally off-the-shelf, but may be blocked or screened by cargo stacked in front of the sensor.

Chemical/biological agents will be difficult and costly to detect, principally because extremely small amounts of these agents must be sensed with high accuracy (low false negatives and false positives). The invention can include a chemical or biochemical "lab-on-a-chip" detector. A less expensive chem/bio detection system for containers can mount the detector on or close to the transfer crane, where the container could be passed through a "sniffer tunnel" for rapid online examination. In addition, individual chem./bio detector(s) can be mounted in and/or on the container(s).

Shock and/or acceleration sensing for sensitive cargoes can be realized with any one of several technologies, including MEMS/electronic devices (similar to automotive airbag sensors), glass beads or granules (for shock or tilt-limit sensing), piezoelectric devices (e.g., classic accelerometers), micro-cantilevers and induction sensors (e.g., geophones). The principal constraint is generally that of available power; most of these devices require too much power to be easily handled by a small battery for a significant time (e.g., a month). However, the use of a continually time-sampled acceleration profile could be of great value in tracking fragile cargoes and determining instances of overly rough handling of containers in transit. Most of these types of sensors are currently available commercially, and appropriately packaging and interfacing them to the container telemetry system would be quick and easy.

Refrigerated container systems, particularly the compressor and cooling system components, would ideally be monitored using the techniques discussed previously related to the reefers. This compressor and cooling system technology, including the electrical-signature analysis components, is readily available commercially and would be straightforward to implement for the transportation environment.

The typical container tag—whether a simple long-range ID device or a more elaborate data-acquisition/telemetry device for detailed monitoring of container security and internal conditions (i.e., temperature, humidity, shock) is preferably battery-powered. Thus, careful unit and system design is also preferred to ensure proper unattended operation for long intervals, thereby ensuring wide acceptance by the shipping industry. The tags should preferably have periods of maintenance-free use of at least approximately one year. Most shipping firms would desire intervals of 3 to 5 years, approximating the lightly-loaded life of a camera-style lithium battery, which is the highest energy-density format currently available in an easily obtainable commercial product. Since the shelf life of lithium ion batteries is typically on the order of 10 years, sealed container tags stored in a deenergized state for several years before use should still exhibit the normal operational lifetime goal of 3-5 years. Suggested tag query intervals in most projected scenarios range from one to four times daily, depending on the type of container; the relative fragility or sensitivity of its cargo; and other factors such as security, cargo value, theft potential, and traumatic events (e.g., a container going overboard). Some of the latter factors may also dictate the deployment of an emergency transmitter or beacon on the container to facilitate immediate crew response to such urgent situations. A routine query once per hour (expending an average of 10 mA for 10 seconds), assuming a typical battery capacity of 1400 mAh (3-V AA size), would result in an effective operational battery life of slightly over 5 years. If recharging were implemented, this interval could easily exceed 20 years, which is probably close to the expected lifetime of the electronics package. Although solar recharging is a preferred recharging mechanism to be employed, other power mechanisms are possible, including micro-fuel cells, kinetic generators (e.g., micro-pendulum or MEMS types), thermopiles (temperature-differential), and even RF energy scavenging.

An embodiment of the invention can include embedding the RFID tag into the structure of a container. An embodiment of the invention can include providing a plurality of RFID tags on a single container for redundancy or as (non)functional decoy(s).

Space Charge Dosimeters for Extremely Low Power Measurements of Radiation in Shipping Containers Electronic dosimeter devices can measure the dose in the container, but they must be powered (active) during integration times. Therefore, they must integrate over short periods to conserve battery power (thus reducing sensitivity). Utilizing large size or quantities of batteries is not economically feasible, nor is replacing batteries during the life of the container (typical shipping container life is 5 to 7 years).

What is needed is a simple, rugged, low cost, low power device which can be installed in every shipping container to passively integrate radiation dose. During transport this device could integrate the radiation dose over very long periods to obtain a very sensitive measurement of the presence of radiation in the container. Even well shielded radioactive material will result in a slight increase in the background radiation levels in the container. What is also needed is a device that can reduce the incidence of false positives.

Space charge dosimeters (SCD) are capable of passively integrating radiation dose continuously, while only requiring power for readout or to recharge the device. These devices work by charging or generating an initial potential between an anode and a cathode. A dielectric media is located between the cathode and anode. This potential creates an electric field across the dielectric media. As radiation passes through the dielectric material, it causes ionization of the dielectric. The electric field then sweeps the ions or charge carriers out of the dielectric, thus reducing the potential between the anode and cathode. The measurement of the depleted charge during the exposure period is a measure of integrated ionization during the measurement period. The charge (or some physical aspect of the device controlled by the charge) is read before and after the exposure to obtain a dose rate.

Utilizing various materials as filters around an SCD, the type of radiation sensed can be determined or the energy range of the radiation determined. A suite (plurality) of these low-cost sensors in each container with a different filter around each SCD can give, not only an indication of increased background radiation, but an indication of the type and energy levels of the radiation. This can help identify the potential type of radioactive material in a container, e.g., identify whether increased radiation levels in a container are due to bananas (potassium-40) rather than from cobalt-60 in a lead shielded box.

An embodiment of the invention can solve the problem of how to measure radiation in a shipping container where the radiation sensor must be low cost and battery powered but still have a battery life of many years. An embodiment of the invention can utilize very low cost space charge dosimeters (SCDs), such as electret ion chambers (EICs), field effect transistors (FETs) such as IGFETs (Insulated Gate Field Effect Transistor), MOSFETs (Metal Oxide Semiconductor Field Effect Transistors) and/or micro-cantilevers, to passively integrate radiation dose. In these devices, radiation passing through the sensitive volume of the dosimeter (the air chamber for EIC's or the dielectric layer for FETs and micro-cantilevers) ionizes the gas or dielectric (i.e., creates charge pairs). These radiation induced charges then lead to a change in the potential or electric field of the device. This change in the potential or electric field is proportional to the radiation dose received.

An embodiment of the invention can include an active radiation detection volume of material that is an electrical insulator. When radiation impacts this volume, electric charge is created that is trapped within the volume. This trapped charge changes the electric field distribution within the volume. An embodiment of the invention can then sense this change in field by placing electrodes on opposite sides of the volume. It is important to note that these electrodes will react to this field. If these electrodes are, for example, the gate and body of a IGFET transistor, an embodiment of the invention can indirectly measure the change in field by monitoring the channel conductance of the transistor without disturbing the trapped charge. Alternatively, if an embodiment of the invention includes a detection volume in which the generated charge moves toward an insulated electrode, such as, for example, a microcantilever, the embodiment of the invention can read the cantilever deflection and achieve the same results.

Intermittently reading the voltage or potential of the SCD dosimeter gives a reading proportional to the radiation dose received by the device. One or more SCDs can be mounted into the shipping container, optionally in the context of a radio frequency identification tag. During transportation of the container (such as by ship or rail), the SCDs integrate received radiation dose. After a time interval, such as every 24 hours, the voltage potential of each SCD can be read out. The change in potential from reading to reading is proportional to the radiation dose.

Multiple SCDs with various types of filters can be used to discriminate by types of radiation, e.g. gamma, x-ray, neutron or beta, and to discriminate between energy levels of these particles or photons. An SCD placed outside the container or well shielded inside the container can be used to subtract ambient or background radiation.

The data from these radiation sensors can then be relayed to an RFID tag on the container. This RFID tag can collect the data from the radiation sensors, other sensors (for example, temperature, acoustic, etc.), and location information (from, for example GPS or triangulation), and send all of it by wireless communications (e.g., HSS) to a receiver coupled to a central database. At the central database, the radiation dose readings can be analyzed to look for indications that a container has a higher than normal radiation field. A higher than normal radiation level can indicate that a hazardous (radioactive) cargo may be in the container and, therefore, that a particular container needs to be flagged for more detailed inspection.

An embodiment of the invention can include a system that utilizes Space Charge Dosimeters (SCDs). SCDs include Electret Ion Chambers (EICs), semiconductor devices such as Insulated Gate Field Effect Transistors (IGFETs) and/or microcantilevers. The SCDs can be used to continuously monitor radiation levels in shipping containers. These radiation sensors can be combined with a communications and tracking system located on each container to allow real-time world-wide monitoring of the radiation-level in the container as well as the position of the container. Unexplained or higher than expected radiation levels in a container can then used to flag a container for more detailed inspection at the US port of entry, or preferably before the ship ever docks at a US port.

As noted above, the basic principle of operation of SCDs is that the ionizing radiation interacts with a material (such as air or a dielectric) to create charge pairs (ionization). These charge pairs then migrate through the material due to the presence of an electric field. The migration and collection of the charge carriers then causes a reduction in the voltage potential across the device. Once the SCD is charged up, ionization in the active region causes a reduction in the potential. Charging the device takes an extremely small amount of power. Once charged, the device continuously integrates the received dose, measured as a drop in the potential. Thus, reading this potential before and after exposure gives an indication of the received dose. Significantly, the SCD requires no power during the dose integration period. The only time power is required is when charging the device or reading the potential. As also noted above, three possible SCDs that can passively integrate dose are the Electret Ion Chamber (EIC) dosimeter, the Insulated Gate Field Effect Transistor (IGFET) dosimeter, and the Microcantilever dosimeter.

A preferred method of operation of the radiation sensors in this invention is as follows. A container fitted with one or more-radiation sensors and the RFID communications system and then the container is loaded with cargo. The container is then transported to the shipping terminal. The container is then loaded onto a ship for transport to the US or other importing country. During the ocean voyage, a signal is sent to the RFID system to activate the radiation sensor (read sensor to get base-line reading, or recharge sensor and then get baseline reading). The radiation sensor then passively integrates received radiation dose until the RFID system directs the sensor for another reading or a preset amount of time has passed. The radiation sensor then powers up, reads the voltage level, and sends the reading to the RFID system. This reading is then relayed to a surrounding RFID system for collection at one or more central locations and analysis. The dose integration time (intervals) can be anywhere from minutes to days. Since the ocean voyage may last days, it is possible to allow several days of dose integration for extremely sensitive measurements.

A central RFID system can send a message to each container to take a baseline reading when the ship leaves port. The central system can then direct the RFID tags to read the radiation sensors at some regular interval (e.g., every 12 hours or 24 hours) for the duration of the voyage. The sensor readings can be passed up to the RFID central system by the RFID tags, tag readers, site servers, etc., whereupon the received doses are collected and analyzed. As the ship transits the ocean (i.e. during the voyage), any radiation dose readings above expected background levels will be flagged and the appropriate authorities notified. This could permit the ship to be stopped and the container inspected before the ship reaches a US port (or other importing country).

Electrete Ion Chamber (EIC) Dosimeters

An EIC consists of an electrically charged polymer (e.g., Teflon) filament or disk, called an electret, located inside an electrically conductive plastic chamber having a known air volume. The electret serves as a source of high voltage (anode) needed for the chamber to operate as an ion chamber. It also serves as a sensor for the measurement of ionization in the chamber air. The negative ions produced inside the sensitive volume of the chamber by radiation induced ionization of the air are collected by the electret causing a depletion of charge. The measurement of the depleted charge during the exposure period is a measure of integrated ionization during the measurement period. The electret charge can be read before and after the exposure or on a known schedule using a non-contact electret voltage reader.

In a preferred embodiment of this invention, the electret charge reading voltmeter is a very small low cost electronics circuit, or possibly an ASIC chip, which not only reads the electret charge but also recharges the electret as needed. This circuit or chip can also contain sufficient data to convert the measured voltage to a radiation dose and transmit this data over a (e.g., IEEE 1451 compliant) sensor bus.

An additional optional feature of the invention is the incorporation of radiation filtering materials or converters around EICs to make each EIC sensitive to different radiation types (e.g. neutron, gamma or x-ray) or energies (hard x-ray, soft x-ray, etc). Measuring not only the presence or quantity of increased radiation levels but also some qualitative characteristics of the radiation can help distinguish hazardous radioactive cargo from normal safe cargo having a normally higher radiation level (such as bananas, some pottery, etc). Additionally, one EIC sensor can be mounted and shielded to measure background radiation for background subtraction from the sensor measurements inside the container.

EIC devices are shock sensitive and can be partially discharged when shaken or dropped. To prevent false positive radiation measurements due to the severe handling experienced by shipping containers, the invention can incorporate active and passive preventative measures. First, the ability to communicate to each sensor via the RFID tag on each container permits the radiation sensors to integrate dose and then be readout during times of known low shock potential, such as during marine transport. Readings can be taken starting when the ship leaves port and during the duration of the voyage. Second, an accelerometer can be co-located with the sensors to identify shock events of sufficient magnitude to cause discharge of the EIC. After such events, the EIC can be readout and the dose integration time re-initiated.

Field Effect Transistor Dosimeters

FET dosimeter operation is based on the generation of electron-hole pairs in the oxide (or other insulator material having very low hole mobility) of the (e.g., IGFET) structure (gate oxide) due to the ionizing radiation. The energy to produce one electron-hole (e-h) pair in silicon oxide is about 18 eV. The electron mobility is such that electrons collect on the gate of the transistor (assuming an n-channel device) but the hole mobility is much smaller. The holes are therefore effectively immobilized within the oxide between the gate and body. This causes a variation in the electric field between the gate and the channel of the transistor which changes the current-carrying capabilities of the channel. This change can then be read at any time without affecting the dosimetrically-altered electric field. Therefore, the gate bias voltage is a direct measure of the absorbed radiation dose. This technique can be applied to both FETs intentionally manufactured in a given CMOS process or to field-oxide FETs (parasitic FETs, IGFETs), the latter of which will exhibit more sensitivity due to thicker oxides.

Microcantilever Dosimeters

Microcantilever dosimeters are created by making the microcantilever an electrode separated from ground by an insulator. A charge is applied to the microcantilever. This charge remains unchanged until radiation creates electron-hole pairs in the insulator. Thus, absorbed radiation dose is continuously and passively integrated. To read-out the radiation dose, the change in the voltage potential on the microcantilever is measured. This potential or change in potential is determined by measuring the deflection of the microcantilever.

Filters and Converters for Discriminating Between Types of Radiation or Energy Levels The invention can include the use of different types and thicknesses of materials to make radiation sensors sensitive to particular types of radiation or to different energy levels. The invention can include the use of a plurality (e.g., an array) of low-cost detectors, each with a different filter, in the shipping container. Since the types of SCD radiation detectors described above can be mass produced at a very low cost, an array of detectors can be located throughout a container. Filters of varying density metals such as lead, tin, and aluminum can be used to coarsely determine the energy of impinging gamma or x-rays. A radiation converter such as boron or lithium-6 can be used to make the devices sensitive to thermal neutrons. Teflon or a high hydrogen content plastic can be used to increase sensitivity to intermediate energy neutrons. By using an array of detectors, each utilizing a different filter and converter, located inside the container, any radiation detected in the container can be categorized into energy bands (for example, low, mid, and high) and radiation type (beta, x-ray, gamma).

RFID Communications System

The invention can combine the radiation sensors with a communications and tracking system that relays the sensor data and container location to a centralized database where the radiation data from every container can be analyzed to flag containers requiring further detailed inspection. The overall RFID system can be termed a "Marine Asset Security and Tracking (MAST) System." The MAST System is preferably a wireless (RF)-based communications and sensing/telemetry system for tracking and monitoring maritime industry-standard shipping containers, both during loading, unloading, and transfer operations at portside dock facilities, as well as onboard ships during overseas transport of the containers. This system also provides a true inter-modal tracking and monitoring system capable of operating on ships, railroads, over-the-road trucks and within their associated terminal facilities, utilizing both local-terminal communications systems and other wide-area commercial communications systems, including satellite and/or cellular/PCS. This RFID tagging system can include RFID tags attached to each shipping container, local site readers located throughout the ship and in the shipping terminal, one central site server on each ship or in each terminal, and a National Operations Center (NOC) where all data is collected, consolidated, stored, analyzed and disseminated. The shipping containers can be both refrigerated-cargo shipping containers (reefers) and dry-cargo shipping containers (dry-boxes). In addition to identifying and tracking the location of containers or other equipment fitted with one of the RFID tags, each tag is equipped with, for example, an IEEE 1451 sensor interface and extra serial interfaces to permit the connection of a wide range of sensors to the RFID tag to monitor the condition of the container cargo or other tagged equipment. Other sensors which can be connected to the RFID tag include (but are not limited to) temperature, pressure, relative humidity, accelerometer, radiation, door seals, and GPS (Global Positioning System). Additional sensors can also be included for condition monitoring of machinery, such as refrigeration compressors, or to read the diagnostic data port on some refrigerated cargo containers.

This invention can include implementation of a radiation sensor system for the MAST system RFID tags. The MAST system provides the solution to the problem of combining the data from a container installation with an overall monitoring, tracking or communications system, while the problem of not using power during the dose integration time is addressed by using a suite of passively-integrating radiation sensors. An embodiment of the invention can include a class of radiation dosimeters that continuously, passively integrate radiation dose, send this data to the RFID tag on the container via a IEEE 1451 sensor interface, and then transmits this data with position and other sensor data to the MAST system National Operations Center (NOC). At the NOC, all sensor data, container manifest, route traveled by the container and other information is analyzed and used to identify containers for detailed inspection at Ports of Entry.

The invention can include passively integrating radiation dose over long periods, while only using power to read out the received dose. The invention can include connecting a radiation sensor to a RFID system which will communicate out the sensor data in near-real time to a central database where analysis of the sensor data can be performed to identify and flag containers with abnormal radiation readings.

The invention can include insitu polling a suite of passive integrating ionizing radiation sensors including reading-out dosimetric data from a first passive integrating ionizing radiation sensor and a second passive integrating ionizing radiation sensor, wherein the first passive integrating ionizing radiation sensor and the second passive integrating ionizing radiation sensor remain situated where the dosimetric data was integrated while reading-out dosimetric data and wherein the first passive integrating radiation sensor and the second integrating radiation sensor are connected to read-out circuits presenting extremely high impedance while in a passive integration mode and while in an active read-out mode, without destruction of integrated dosimetric data allowing continuous integration of ionizing radiation to a maximum extent of the first passive integrating ionizing radiation sensor and the second passive integrating ionizing radiation sensor. Upon sensing the attainment of maximum integration limits, readout circuits can reset passive integrating radiation sensors and accumulate in a non-volatile manner the number of sensor reset cycles.

The invention can include a first passive integrating ionizing radiation sensor; a second passive integrating ionizing radiation sensor; a read-out circuit coupled to both the first passive integrating ionizing radiation sensor and the second passive integrating ionizing radiation sensor, the read-out circuit presenting an extremely high impedance to both the first passive integrating ionizing radiation sensor and the second passive integrating ionizing radiation sensor both while the read-out circuit is in a passive integration mode and while the read-out circuit is in an active read-out mode; and a communication circuit coupled to the read-out circuit, wherein read-out dosimetric data from both the first passive integrating radiation sensor and the second passive integrating radiation sensor is presented to the communications circuit.

One or both of the first passive integrating ionizing radiation sensor and the second passive integrating ionizing radiation sensor can include a thick oxide insulated gate field effect transistor space charge dosimeter. The read-out circuits can present impedance of from approximately $10^{11}$ ohms to approximately $10^{15}$ ohms, preferably from approximately $10^{12}$ ohms to approximately $10^{14}$ ohms, most preferably approximately $10^{13}$ ohms.

As noted above, the invention can include a thick oxide dosimeter (TOD). In such a TOD, the FETs can be arranged such that the gates are connected to two or more levels of metal or polysilicon. This will increase the active volume of $SiO_2$ that can interact with ionizing radiation. These devices have the significant optional advantage of temperature and process compensation by reading out the voltage between the drains assuming the sources are connected to a common electrical potential. The gates and drains for a given IGFET can be connected together.

This technique can be extended by simply adding FETS and stacking metal layers on top of each other to the limits of the semiconductor fabrication process being used. The advantage of this is that the active volume of the oxide used for detection is increased but the electric field created by a trapped charge between any two plates is reduced by the increase in distance between the plates. As many plates as the fabrication process allows can be used to obtain the greatest electric field for a given ionizing radiation event to ensure the greatest probability of detection.

Figure 11:
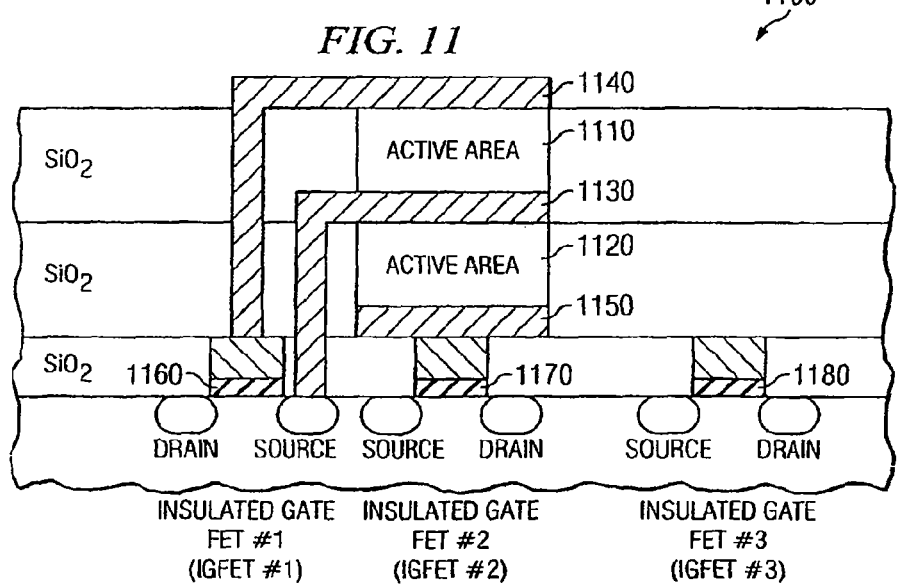
FIG. 11 illustrates a schematic structural diagram of an insitu polled sensor with integrated temperature compensation, representing an embodiment of the invention.

FIGS. 10-11 depict two IGFET examples of the invention. The use of the terms first, second and third in describing elements depicted in these figures is only for distinguishing between similar elements and the assignment of these terms is arbitrary.

Referring to FIG. 10, a suite of passive integrating ionizing radiation sensors includes a first sensor 1010 shielded by a first filter 1011. This suite of passive integrating ionizing radiation sensors also includes a second sensor 1020 shielded by a second filter 1021. The first sensor 1010 and the second sensor 1020 are both coupled to a communications circuit 1030. A temperature compensation circuit 1040 is coupled to the communications circuit 1030. A calibration circuit 1050 is also coupled to the communications circuit 1030. Each of the sensors 1010, 1020 is based on a pair of insulated gate field effect transistors.

The invention can include an apparatus, comprising: a thick oxide dosimeter; and a readout circuit coupled to the thick oxide dosimeter, wherein both the thick oxide dosimeter and the readout circuit are constructed on a single high impedance and low leakage substrate. The thick oxide dosimeter can include a thick oxide insulated gate field effect transistor space charge dosimeter. The single high impedance and low leakage substrate can include a construction of silicon on sapphire, silicon on insulator and/or transmutated high resistivity silicon. The substrate can have an impedance of from approximately $10^{11}$ ohms to approximately $10^{15}$ ohms, preferably from approximately $10^{12}$ ohms to approximately $10^{14}$ ohms, most preferably approximately $10^{13}$ ohms.

Referring to FIG. 11, a passive integrating ionizing radiation sensor 1100 includes a first active area (region) 1110 and a second active area (region) 1120. The second active area 1110 is sandwiched between a common conductor 1130 and a first active area conductor 1140. The second active area 1120 is sandwiched between the common conductor 1130 and a second active area conductor 1150. The first active area conductor 1140 is coupled to the gate of a first insulated gate field effect transistor 1160. The second active area conductor 1150 is coupled to the gate of a second insulated gate field effect transistor 1170. The sources of both the first insulated gate field effect transistor 1160 and the second insulated gate field effect transistor 1170 are connected together and coupled to the common conductor 1130. A third insulated gate field effect transistor 1180 provides an integrated temperature compensation functionality.

During passive-mode dosimetry operation of the examples depicted in FIG. 11, ionizing radiation passes through the active area and generates a net charge that is trapped in the oxide. This charge generates an electric field between the adjacent conductors thus creating a net change in the resistance seen between the source and gate of the FET whose active area was hit. During readout operation of the examples depicted in FIG. 11, the resistance between the source and each drain is read. The net amount of radiation is proportional to the change in resistance. Temperature compensation is applied by tracking the change in the third IGFET which has a much smaller radiation sensitivity than the others.

The invention can include a first insulated gate field effect transistor including a first source, a first drain and a first insulated gate; a second insulated gate field effect transistor including a second source, a second drain and a second insulated gate, the second source coupled to the first source; a first conductor coupled to the second gate; a first active region connected to the first conductor, the first active region accumulating dosimetric data from incident ionizing radiation; a second conductor connected to the first active region; a second active region coupled to the second conductor, the second active region accumulating dosimetric data from incident ionizing radiation; and a third conductor coupled between the second active region and the first gate, wherein the second conductor is coupled to both the first source and the second source. A third insulated gate field effect transistor can provide temperature compensation data.

The invention can include arranging a plurality of sensors in a spatially dispersed (e.g., an array) configuration and setting an alarm condition based on a reading in multiple sensors.

The invention can include pattern recognition. For example, a method can include arranging a plurality of passive integrating ionizing radiation sensors in a spatially dispersed array; determining a relative position of each of the plurality of passive integrating ionizing radiation sensors to define a volume of interest; collecting ionizing radiation data from at least a subset of the plurality of passive integrating ionizing radiation sensors; and triggering an alarm condition when collected ionizing radiation data from the subset of the plurality of passive integrating ionizing radiation sensors meets a predetermined spatial pattern criterion. The predetermined spatial pattern criterion can include a plurality of alternative patterns. The predetermined spatial pattern criterion can include a dosimetric data pattern defined by a function that includes a cube root of a radius from an approximate location of an ionizing radiation source.

Embodiments of the invention, can be cost effective and advantageous for at least the following reasons. An embodiment of the invention can provide world-wide asset and/or cargo tracking, monitoring and security. An embodiment of the invention can include Integrating RFID tag data in a GIS-based system for asset tracking, management, and visualization. An embodiment of the invention can include RFID tag communications utilizing hybrid spread-spectrum signaling. An embodiment of the invention can include multi-access technology allowing communications with over 10,000 RFID tags, while ignoring up to 90,000 tags, in the same RFID tag reader zone. Embodiments of the invention improves quality and/or reduces costs compared to previous approaches.

The phrase hybrid spread-spectrum (HSS) as used herein is defined as a combination of direct sequence spread-spectrum (DSSS), for example code division multiple access (CDMA), and at least one of frequency hopping, time hopping, time division multiple access (TDMA), orthogonal frequency division multiplexing OFDM and/or spatial division multiple access (SDMA). The terms a or an, as used herein, are defined as one or more than one. The term plurality, as used herein, is defined as two or more than two. The term another, as used herein, is defined as at least a second or more. The terms "comprising" (comprises, comprised), "including" (includes, included) and/or "having" (has, had), as used herein, are defined as open language (i.e., requiring what is thereafter recited, but open for the inclusion of unspecified procedure(s), structure(s) and/or ingredient(s) even in major amounts. The terms "consisting" (consists, consisted) and/or "composing" (composes, composed), as used herein, close the recited method, apparatus or composition to the inclusion of procedures, structure(s) and/or ingredient(s) other than those recited except for ancillaries, adjuncts and/or impurities ordinarily associated therewith. The recital of the term "essentially" along with the terms "consisting" or "composing" renders the recited method, apparatus and/or composition open only for the inclusion of unspecified procedure(s), structure(s) and/or ingredient(s) which do not materially affect the basic novel characteristics of the composition. The term coupled, as used herein, is defined as connected, although not necessarily directly, and not necessarily mechanically. The term any, as used herein, is defined as all applicable members of a set or at least a subset of all applicable members of the set. The term approximately, as used herein, is defined as at least close to a given value (e.g., preferably within 10% of, more preferably within 1% of, and most preferably within 0.1% of). The term substantially, as used herein, is defined as largely but not necessarily wholly that which is specified. The term generally, as used herein, is defined as at least approaching a given state. The term deploying, as used herein, is defined as designing, building, shipping, installing and/or operating. The term means, as used herein, is defined as hardware, firmware and/or software for achieving a result. The term program or phrase computer program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer or computer system. The term proximate, as used herein, is defined as close, near adjacent and/or coincident; and includes spatial situations where the specified functions and/or results can be carried out and/or achieved. The phrase radio frequency, as used herein, is defined as including infrared, as well as frequencies less than or equal to approximately 300 GHz.

All the disclosed embodiments of the invention disclosed herein can be made and used without undue experimentation in light of the disclosure. An embodiment of the invention is not limited by theoretical statements recited herein. Although the best mode of carrying out embodiments of the invention contemplated by the inventor(s) is disclosed, practice of an embodiment of the invention is not limited thereto. Accordingly, it will be appreciated by those skilled in the art that an embodiment of the invention may be practiced otherwise than as specifically described herein.

It will be manifest that various substitutions, modifications, additions and/or rearrangements of the features of an embodiment of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

All the disclosed elements and features of each disclosed embodiment can be combined with, or substituted for, the disclosed elements and features of every other disclosed embodiment except where such elements or features are mutually exclusive. Variation may be made in the steps or in the sequence of steps defining methods described herein.

Although the sensor(s) with or without their filters described herein can be a separate module, it will be manifest that the sensor(s) may be integrated into the system with which it is (they are) associated. The individual components need not be formed in the disclosed shapes, or combined in the disclosed configurations, but could be provided in all shapes, and/or combined in all configurations. The individual components need not be fabricated from the disclosed materials, but could be fabricated from all suitable materials.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

The invention claimed is:

1. An apparatus, comprising:
a first insulated gate field effect transistor including a first source, a first drain and a first insulated gate;
a second insulated gate field effect transistor including a second source, a second drain and a second insulated gate, the second source coupled to the first source;
a first conductor coupled to the second gate;
a first active region connected to the first conductor, the first active region accumulating dosimetric data from incident ionizing radiation;
a second conductor connected to the first active region;
a second active region coupled to the second conductor, the second active region accumulating dosimetric data from incident ionizing radiation; and
a third conductor coupled between the second active region and the first gate,
wherein the second conductor is coupled to both the first source and the second source.

2. The apparatus of claim 1, further comprising a third insulated gate field effect transistor that provides temperature compensation data.

* * * * *